United States Patent
Yu et al.

(10) Patent No.: US 11,417,653 B2
(45) Date of Patent: Aug. 16, 2022

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Jia-Ni Yu, New Taipei (TW); Kuo-Cheng Chiang, Hsinchu County (TW); Lung-Kun Chu, New Taipei (TW); Chung-Wei Hsu, Hsinchu County (TW); Chih-Hao Wang, Hsinchu County (TW); Mao-Lin Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 128 days.

(21) Appl. No.: 16/782,858

(22) Filed: Feb. 5, 2020

(65) Prior Publication Data

US 2021/0098455 A1   Apr. 1, 2021

Related U.S. Application Data

(60) Provisional application No. 62/908,060, filed on Sep. 30, 2019.

(51) Int. Cl.
*H01L 27/092* (2006.01)
*H01L 29/06* (2006.01)
(Continued)

(52) U.S. Cl.
CPC .. *H01L 27/0922* (2013.01); *H01L 21/823807* (2013.01); *H01L 21/823821* (2013.01);
(Continued)

(58) Field of Classification Search
CPC ............. H01L 27/0922; H01L 27/0924; H01L 29/42392; H01L 29/78696
See application file for complete search history.

(56) References Cited

U.S. PATENT DOCUMENTS 9,209,247 B2   12/2015   Colinge et al.
9,236,267 B2    1/2016   De et al.
(Continued)

FOREIGN PATENT DOCUMENTS

DE   102018108598 A1 *  2/2019   ..... H01L 21/823412
EP       3327777 A1 *  5/2018   ........... H01L 29/517
(Continued)

*Primary Examiner* — Victoria K. Hall
(74) *Attorney, Agent, or Firm* — WPAT, P.C., Intellectual Property Attorneys; Anthony King

(57) ABSTRACT

A semiconductor structure includes a substrate including a first region and a second region, a first FET device disposed in the first region, and a second FET device disposed in the second region. The first FET device includes a fin structure, a first work function metal layer disposed over the fin structure, and a high-k gate dielectric layer between the first work function metal layer and the fin structure. The second FET device includes a plurality of nanosheets stacked over the substrate and separated from each other, a second work function metal layer surrounding each of the nanosheets, and the high-k gate dielectric layer between the second work function metal layer and each of the nanosheets. In some embodiments, the fin structure has a first width, each of the nanosheets has a second width, and the second width is greater than the first width.

20 Claims, 16 Drawing Sheets

(51) Int. Cl.
*H01L 29/10* (2006.01)
*H01L 21/8238* (2006.01)
*H01L 29/423* (2006.01)
*H01L 27/02* (2006.01)
*H01L 27/11* (2006.01)
*H01L 29/04* (2006.01)
*H01L 29/786* (2006.01)

(52) U.S. Cl.
CPC .. *H01L 21/823842* (2013.01); *H01L 27/0207* (2013.01); *H01L 27/0924* (2013.01); *H01L 27/1104* (2013.01); *H01L 29/045* (2013.01); *H01L 29/0673* (2013.01); *H01L 29/1037* (2013.01); *H01L 29/42392* (2013.01); *H01L 29/78696* (2013.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,530,778 B1* | 12/2016 | Lin | H01L 29/511 |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,332,803 B1* | 6/2019 | Xie | H01L 27/0924 |
| 10,615,288 B1* | 4/2020 | Kong | H01L 29/66439 |
| 10,756,089 B2* | 8/2020 | Chiang | H01L 29/78696 |
| 10,867,864 B2* | 12/2020 | Wu | H01L 21/823864 |
| 10,930,762 B2* | 2/2021 | Ando | H01L 29/66439 |
| 11,031,395 B2* | 6/2021 | Ohtou | H01L 29/0649 |
| 11,088,255 B2* | 8/2021 | Chung | H01L 29/0665 |
| 2015/0187763 A1* | 7/2015 | Kim | H01L 27/0924 257/392 |
| 2015/0214228 A1* | 7/2015 | Koh | H01L 21/845 257/369 |
| 2015/0380409 A1* | 12/2015 | Togo | H01L 21/26513 257/369 |
| 2016/0049400 A1* | 2/2016 | Togo | H01L 21/26513 257/369 |
| 2016/0254260 A1* | 9/2016 | Sheen | H01L 29/785 257/369 |
| 2016/0365347 A1* | 12/2016 | Bao | H01L 21/32139 |
| 2017/0069630 A1* | 3/2017 | Cha | H01L 21/823821 |
| 2017/0133278 A1* | 5/2017 | Bao | H01L 21/8234 |
| 2017/0243865 A1* | 8/2017 | Lee | H01L 27/0924 |
| 2017/0263608 A1* | 9/2017 | Gan | H01L 27/0922 |
| 2017/0271212 A1* | 9/2017 | Clark | H01L 29/66545 |
| 2018/0019242 A1* | 1/2018 | Liao | H01L 29/517 |
| 2018/0138185 A1* | 5/2018 | Hsu | H01L 21/823878 |
| 2018/0151573 A1* | 5/2018 | Li | H01L 29/4966 |
| 2018/0277540 A1* | 9/2018 | Jagannathan | H01L 21/28088 |
| 2019/0131185 A1* | 5/2019 | Huang | H01L 21/823857 |
| 2019/0131394 A1* | 5/2019 | Reznicek | H01L 29/775 |
| 2019/0157410 A1* | 5/2019 | Yim | H01L 21/823842 |
| 2019/0214473 A1* | 7/2019 | Xie | H01L 21/823431 |
| 2019/0287970 A1* | 9/2019 | Jagannathan | H01L 29/1033 |
| 2019/0355724 A1* | 11/2019 | Chiang | H01L 21/324 |
| 2020/0027965 A1* | 1/2020 | Joshi | H01L 28/20 |
| 2020/0035563 A1* | 1/2020 | Zhang | H01L 29/401 |
| 2020/0035842 A1* | 1/2020 | Kim | B82Y 10/00 |
| 2020/0044049 A1* | 2/2020 | Yeoh | H01L 29/7843 |
| 2020/0058558 A1* | 2/2020 | Chu | H01L 21/31155 |
| 2020/0066839 A1* | 2/2020 | Zhang | H01L 29/78618 |
| 2020/0075594 A1* | 3/2020 | Xiao | H01L 21/823814 |
| 2020/0083326 A1* | 3/2020 | Ok | H01L 27/092 |
| 2020/0091349 A1* | 3/2020 | Kang | H01L 27/092 |
| 2020/0105602 A1* | 4/2020 | Wu | H01L 21/28079 |
| 2020/0105750 A1* | 4/2020 | Xiao | B82Y 10/00 |
| 2020/0105761 A1* | 4/2020 | Liaw | H01L 29/66545 |
| 2020/0105762 A1* | 4/2020 | Xiao | H01L 21/8238 |
| 2020/0105893 A1* | 4/2020 | Xiao | H01L 29/775 |
| 2020/0111785 A1* | 4/2020 | Xiao | H01L 27/092 |
| 2020/0118888 A1* | 4/2020 | Bao | H01L 27/0922 |
| 2020/0135937 A1* | 4/2020 | Kong | H01L 29/42392 |
| 2020/0235133 A1* | 7/2020 | Xiao | H01L 27/1211 |
| 2020/0258785 A1* | 8/2020 | Zhang | H01L 21/324 |
| 2020/0287046 A1* | 9/2020 | Frougier | H01L 29/0673 |
| 2020/0303375 A1* | 9/2020 | Fukuzaki | H01L 29/42392 |
| 2020/0403099 A1* | 12/2020 | Cheng | H01L 29/0847 |
| 2020/0411515 A1* | 12/2020 | Kim | H01L 29/0673 |
| 2021/0020643 A1* | 1/2021 | Yang | H01L 29/7851 |
| 2021/0057550 A1* | 2/2021 | Cheng | H01L 29/513 |
| 2021/0082915 A1* | 3/2021 | Bao | H01L 29/0665 |
| 2021/0098605 A1* | 4/2021 | Wang | H01L 29/66636 |
| 2021/0098625 A1* | 4/2021 | Tsai | H01L 29/66795 |
| 2021/0296312 A1* | 9/2021 | Chou | H01L 29/42392 |
| 2021/0296317 A1* | 9/2021 | Ohtou | B82Y 10/00 |
| 2021/0296318 A1* | 9/2021 | Wang | H01L 29/66545 |

FOREIGN PATENT DOCUMENTS

| | | | | |
|---|---|---|---|---|
| WO | WO-2013101007 A1 * | 7/2013 | | H01L 21/823431 |
| WO | WO-2015195134 A1 * | 12/2015 | | H01L 21/823412 |

\* cited by examiner

SEMICONDUCTOR STRUCTURE AND METHOD FOR FORMING THE SAME

PRIORITY DATA

This patent claims the benefit of U.S. Provisional Patent Application Ser. No. 62/908,060 filed Sep. 30, 2019, the entire disclosure of which is hereby incorporated by reference.

BACKGROUND

In the fabrication of semiconductor integrated circuit (IC) devices, various device features such as insulating layers, conductive layers, semiconductive layers, etc., are formed on a semiconductor substrate. It is well known that the processes in which these features are formed are factors in quality of a fabricated IC device. In addition, the quality of the fabricated device and the cleanliness of the manufacturing environment in which the IC device is processed are, in turn, factors in the yield of an IC fabrication process.

Multi-threshold voltage IC devices are often utilized in the semiconductor integrated circuit (IC) industry to optimize delay or power utilization. A multi-threshold voltage IC device may include several different devices, each having a different threshold voltage (i.e., operating voltage). For example, the multi-threshold voltage IC device may include a low threshold voltage device and a high threshold voltage device. One approach to achieving the different threshold voltage devices includes increasing a channel length of the higher threshold voltage devices. However, as technology node sizes continue to decrease, functional density (i.e., the number of interconnected devices per chip area) has generally increased while geometry size (i.e., the smallest component (or line) that can be created using a fabrication process) has decreased. Increasing channel lengths to accommodate higher threshold voltage devices thus consumes valuable IC device space, limiting the amount of devices that can be fabricated on a single chip. Furthermore, greater channel length reduces the ON current and as increases capacitance, thus reducing the speed of device operation.

Accordingly, although existing approaches for fabricating multi-threshold voltage devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
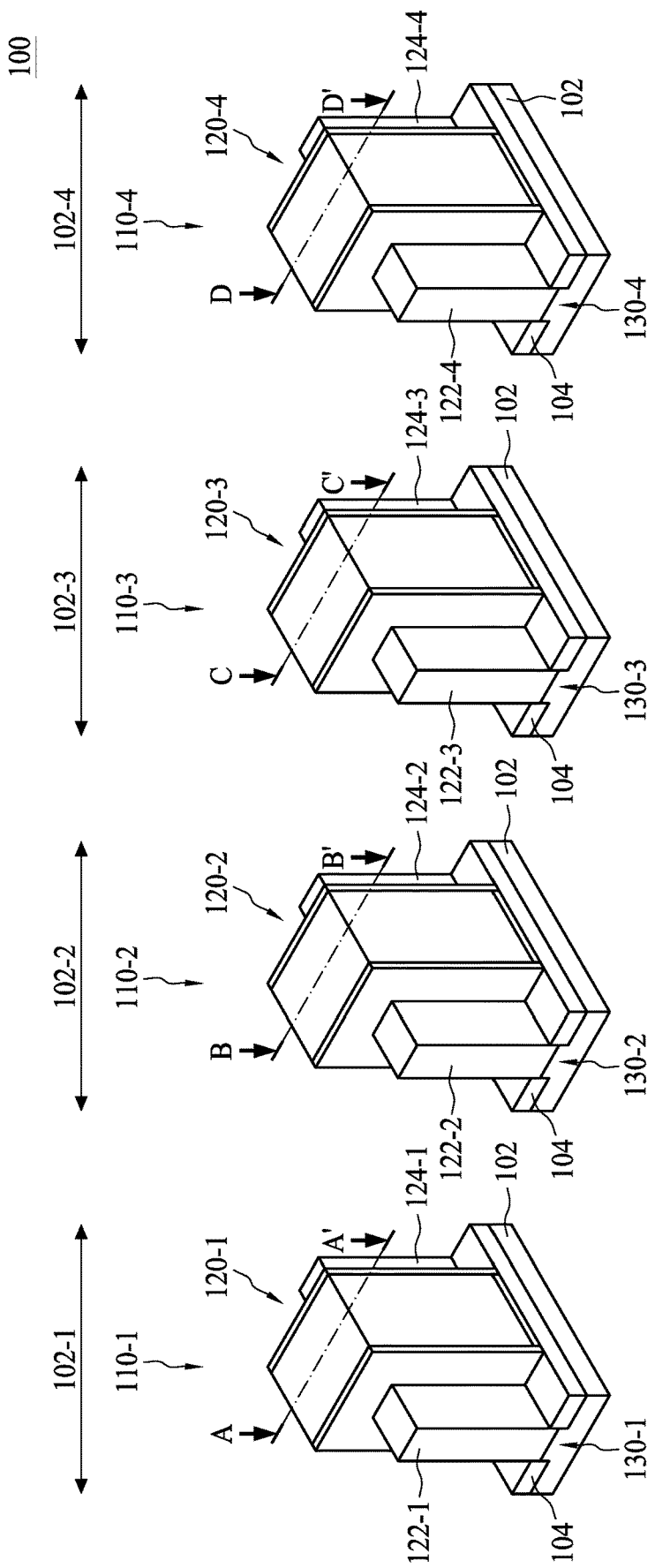
FIG. 1 is a perspective view illustrating a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "nanosheet" refers to atomic, molecular or macromolecular particles typically in a thickness scale of approximately 1 to 100 nanometer range and a width greater than the thickness. For example, the width may be at least twice the thickness, but the disclosure is not limited thereto. Typically, the novel and differentiating properties and functions of nanosheet are observed or developed at a critical length scale of matter typically under 100 nm. In some embodiments, the term "nanosheet" can also referred to as "nano-slab," "nano-ring" or "multi-bridge channel".

Static random access memory (SRAM) is commonly used in integrated circuits. SRAM cells have the advantageous feature of holding data without a need for refreshing. SRAM cells may include different numbers of transistors and are often accordingly referred to by the number of transistors, for example, six-transistor (6-T) SRAM, eight-transistor (8-T) SRAM, and the like. The transistors typically form a data latch for storing a bit. Additional transistors may be formed to construct core or logic circuits to control access to the transistors.

With the ongoing down-scaling of integrated circuits, power supply voltages of the core or logic circuits are reduced, along with the power supply voltages of memory circuits. However, the voltage reduction in the core or logic circuits and the voltage reduction in memory circuits may not be the same. Similarly, threshold voltage (Vt) requirements may be different between the memory circuits and the core circuits. For example, for high-current SRAM (HC-SRAM), voltage, i.e., the threshold voltage (Vt), may be different from that of the core devices. Further, the Vt of devices, such as pulldown transistors, i.e., the n-type transistors, of the HC-SRAM may be customized according to different product requirements.

It is therefore difficult to build an integrated circuit having a core circuit and a memory circuit with different Vt requirements, and further having a memory circuit with different Vt requirements for different transistors.

The present disclosure provides a semiconductor structure and method for forming the same. In some embodiments, the semiconductor structure includes a FET device used in a memory circuit. In some embodiments, the FET device is a pulldown device. In some embodiments, the FET device is an n-type nanosheet FET device. In some embodiments, the semiconductor structure includes other FET devices, such as a p-type FET device for a memory circuit, a p-type FET device for a core circuit and/or an n-type FET for a core circuit. In some embodiments, the aforementioned FET devices are FinFET devices. By providing the n-type nanosheet FET device, Vt of the pulldown device can be easily customized to cause less influence on other devices.

FIG. 1 is a cross-sectional view illustrating a semiconductor structure according to aspects of the present disclosure. In some embodiments, a semiconductor structure 100 is provided. The semiconductor structure 100 includes a substrate 102. In some embodiments, the substrate 102 has a first region 102-1, a second region 102-2, a third region 102-3 and a fourth region 102-4 defined thereon. In some embodiments, the substrate 102 may be a semiconductor substrate such as a silicon substrate. The substrate 102 may also include other semiconductors such as germanium (Ge), silicon carbide (SiC), silicon germanium (SiGe), or diamond. Alternatively, the substrate 102 may include a compound semiconductor and/or an alloy semiconductor. The substrate 102 may include various layers, including conductive or insulating layers formed on a semiconductor substrate. The substrate 102 may include various doping configurations depending on design requirements as is known in the art. For example, different doping profiles (e.g., n wells or p wells) may be formed on the substrate 102 in regions 102-1 to 102-4 designed for different device types (e.g., n-type field effect transistors (NFET), or p-type field effect transistors (PFET)). The suitable doping may include ion implantation of dopants and/or diffusion processes. The substrate 102 typically has isolation structures, e.g., shallow trench isolation (STI) structures 104, interposing the regions 102-1 to 102-4. Further, the substrate 102 may optionally include an epitaxial layer (epi-layer), may be strained for performance enhancement, may include an SOI structure, and/or may have other suitable enhancement features.

The regions 102-1 to 102-4 are defined for accommodating different FET devices. In some embodiments, the first region 102-1 to the third region 102-3 can be defined to accommodate FET devices used to form standard cells, memory cells, a core or logic circuit, or input/output (IO) circuit, while the fourth region 102-4 can be defined to accommodate FET devices used to form a memory circuit, but the disclosure is not limited thereto. In some embodiments, the first region 102-1 is defined to accommodate an n-type FET device and the second region 102-2 is defined to accommodate a p-type FET device, but the disclosure is not limited thereto. In some embodiments, the third region 102-3 is defined to accommodate a p-type FET device and the fourth region 102-4 is defined to accommodate an n-typed FET device, but the disclosure is not limited thereto. In some other embodiments, the fourth region 102-4 is defined to accommodate an n-type pulldown device used to form the memory circuit, but the disclosure is not limited thereto.

As shown in FIG. 1, a first FET device 110-1 is disposed in the first region 102-1. In some embodiments, the first FET device 110-1 is an n-type device. The first FET device 110-1 can include a gate structure 120-1 and source/drain structures 122-1 and 124-1. In some embodiments, the first FET device 110-1 is a first FinFET device, and a first fin structure 130-1 is disposed over the substrate 102, as shown in FIG. 1. A portion of the first fin structure 130-1 covered by the gate structure 120-1 serves as a channel region, and portions of the first fin structure 130-1 exposed through the gate structure 120-1 serve as the source/drain structures 122-1 and 124-1. In some embodiments, the first FinFET device 110-1 can be an n-type fully-strained channel (NFSC) FinFET, and thus the first fin structure 130-1 can include silicon/carbon-doped silicon (Si/Si:C). As a result, electron mobility is improved by the fully strained Si channel.

As shown in FIG. 1, a second FET device 110-2 is disposed in the second region 102-2. In some embodiments, the second FET device 110-2 is a p-type device. The second FET device 110-2 can include a gate structure 120-2 and source/drain structures 122-2 and 124-2. In some embodiments, the second FET device 110-2 is a second FinFET device, and a second fin structure 130-2 is disposed over the substrate 102, as shown in FIG. 1. A portion of the second fin structure 130-2 covered by the gate structure 120-2 serves as a channel region, and portions of the second fin structure 130-2 exposed through the gate structure 120-2 serve as the source/drain structures 122-2 and 124-2. In some embodiments, the second FinFET device 110-2 can be a p-type fully-strained channel (PFSC) FinFET, and thus the second fin structure 130-2 can include silicon germanium. As a result, hole mobility is improved by the fully-strained SiGe channel. In other embodiments, the second fin structure 130-2 can have a (110) crystal plane, such that the hole mobility is improved.

As shown in FIG. 1, a third FET device 110-3 is disposed in the third region 102-3. In some embodiments, the third FET device 110-3 is a p-type device. In some embodiments, the third FET device 110-3 is a p-type pull-up device. The third FET device 110-3 can include a gate structure 120-3 and source/drain structures 122-3 and 124-3. In some embodiments, the third FET device 110-3 is a third FinFET device, and a third fin structure 130-3 is disposed over the substrate 102, as shown in FIG. 1. A portion of the third fin structure 130-3 covered by the gate structure 120-3 serves as a channel region, and portions of the third fin structure 130-3 exposed through the gate structure 120-3 serve as the source/drain structures 122-3 and 124-3. In some embodiments, the third FinFET device 110-3 can be a PFSC FinFET, and therefore the second fin structure 130-3 can include silicon germanium. As a result, hole mobility is improved by the fully-strained SiGe channel. In other embodiments, the third fin structure 130-3 can have a (110) crystal plane, such that the hole mobility is improved.

As shown in FIG. 1, a fourth FET device 110-4 is disposed in the fourth region 102-4. In some embodiments, the fourth FET device 110-4 is an n-type device used to form a memory circuit. In some embodiments, the fourth FET device 110-4 is an n-type pull-down device. The fourth FET device 110-4 can include a gate structure 120-4 and source/drain structures 122-4 and 124-4. In some embodiments, the fourth FET device 110-4 is a nanosheet FET device, and a nano-sheet stack 130-4 is disposed over the substrate 102. The nanosheet stack 130-4 includes a plurality of nanosheets 132 (shown in FIG. 2) stacked over the substrate 102 and separated from each other. A portion of each nano-sheet 132 in the nanosheet stack 130-4 covered or surrounded by the gate structure 120-4 serves as a channel region, and portions of the nano-sheet stack 130-4 exposed through the gate structure 120-4 serve as the source/drain structures 122-4 and 124-4.

Figure 2:
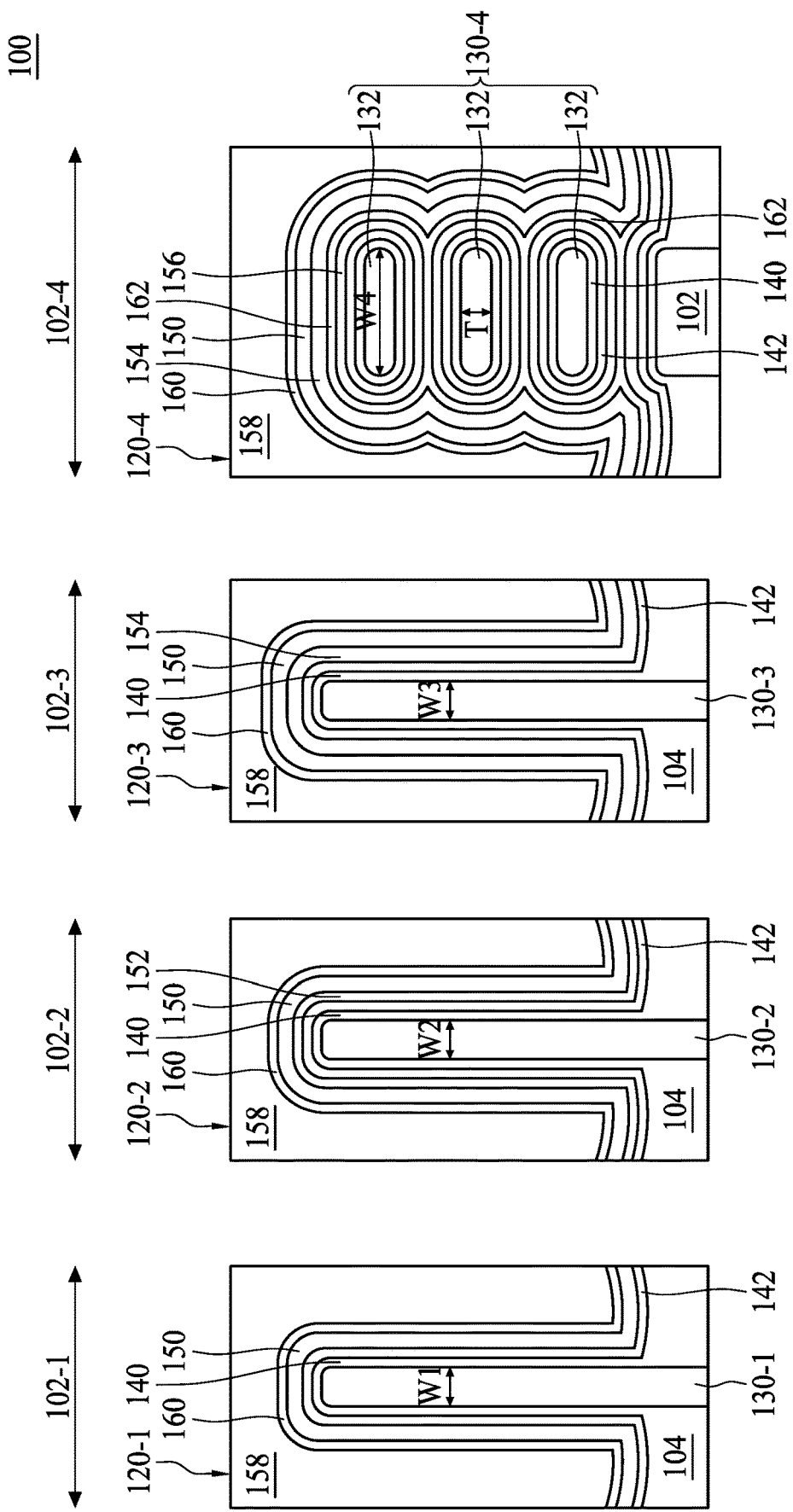
FIG. 2 shows cross-sectional views taken along line A-A', B-B', C-C' and D-D' of FIG. 1, respectively.

Please refer to FIG. 2, which illustrates cross-sectional views taken along lines A-A', B-B', C-C' and D-D' of FIG. 1, respectively. As shown in FIG. 2, the first fin structure 130-1 may have a width W1, the second fin structure 130-2 may have a width W2, and the third fin structure 130-3 may have a width W3. In some embodiments, the width W1 of the first fin structure 130-1 can be between approximately 3 nanometers and approximately 10 nm, but the disclosure is not limited thereto. In some embodiments, the width W2 of the second fin structure 130-2 can be between approximately 3 nm and approximately 10 nm, but the disclosure is not limited thereto. In some embodiments, the width W3 of the third fin structure 130-3 can be between approximately 3 nm and approximately 10 nm, but the disclosure is not limited thereto. In some embodiments, the width W1 the width W2 and the width W3 may be substantially the same, but the disclosure is not limited thereto.

Still referring to FIG. 2. In some embodiments, each of the nanosheets 132 may have a width W4 and a thickness T. In some embodiments, the width W4 of the nanosheet 132 is greater than the width W1 of the first fin structure 130-1, the width W2 of the second fin structure 130-2 and the width W3 of the third fin structure 130-3, as shown in FIG. 2. In some embodiments, the width W4 of the nanosheet 132 is greater than the thickness T of the nanosheet 132. In some embodiments, the width W4 the nanosheet 132 is at least twice the thickness T. For example, the thickness T of the nanosheet 132 can be between approximately 4 nm and approximately 10 nm, and the width W4 of the nanosheet can be between approximately 10 nm and approximately 50 nm, but the disclosure is not limited thereto. In some embodiments, a crystal plane of each of the nanosheets 132 is a (100) plane, which favors electron mobility.

In some embodiments, a height of the first fin structure 130-1, a height of the second fin structure 130-2 and a height of the third fin structure 130-3 are substantially the same. In some embodiments, a height of the nano-sheet stack 130-4 can be similar to the heights of the first, second and third fin structures 130-1, 130-2 and 130-3. Accordingly, a top surface of a topmost nanosheet 132 in the nanosheet stack 130-4 may be at same level as top surfaces of the first, second and third fin structures 130-1, 130-2 and 130-3. In some alternative embodiments, the height of the nano-sheet stack 130-4 can be less than the heights of the first, second and third fin structures 130-1, 130-2 and 130-3. Accordingly, the top surface of the topmost nano-sheet 132 in the nanosheet stack 130-4 is at a level lower than the top surfaces of the first, second and third fin structures 130-1, 130-2 and 130-3.

As shown in FIG. 2, each of the first FinFET device 110-1, the second FinFET device 110-2, the third FinFET device 110-3 and the nanosheet FET device 110-4 includes a high-k gate dielectric layer 142. As shown in FIG. 2, the high-k gate dielectric layer 142 covers the first fin structure 130-1, the second fin structure 130-2 and the third fin structure 130-3. In some embodiments, the high-k gate dielectric layer 142 surrounds each of the nanosheets 132, as shown in FIG. 2. In some embodiments, the high-k gate dielectric layer 142 includes a high-k dielectric material having a high dielectric constant, for example, greater than that of thermal silicon oxide (~3.9). The high-k gate dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfOxNy$), other suitable metal-oxides, or combinations thereof. Further, an interfacial layer (IL) 140 is formed between the high-k gate dielectric layer 142 and the fin structures 130-1, 130-2 and 130-3, and between the high-k gate dielectric layer 142 and each of the nanosheets 132. The IL 140 may include an oxide-containing material such as SiO or SiON.

As shown in FIG. 2, the gate structure 120-1 of the first FinFET device 110-1 may include a metal gate structure. In some embodiments, the metal gate structure 120-1 of the first FinFET device 110-1 may include the IL 140, the high-k gate dielectric layer 142, a first work function metal layer 150 over the high-k gate dielectric layer 142, a passivation layer 160 over the first work function metal layer 150 and a gap-filling metal layer 158. In some embodiments, the metal gate structure 120-1 may further include at least a barrier metal layer (not shown). The barrier metal layer can include, for example but not limited to, TiN. For the n-type FinFET 110-1, one or more of TaAl, TiAlC, TiAl(Si)C, TaAlC and TaSiAlC can be used as the first work function metal layer 150. Further, the first work function metal layer 150 can include a single layer or a multilayer of two or more of these materials, but is not limited to this. A thickness of the first work function metal layer 150 can be between approximately 1 nm and approximately 5 nm, but the disclosure is not limited thereto. The passivation layer 160 can include Si, SiO, SiON, TaN TSN, and the like, but the disclosure is not limited thereto. A thickness of the passivation layer 160 can be between approximately 0.5 nm and approximately 2 nm, but the disclosure is not limited thereto. In some embodiments, a gap-filling metal layer 158 is formed to cover the passivation layer 160.

As shown in FIG. 2, the gate structure 120-2 of the second FinFET device 110-2 may include a metal gate structure. In some embodiments, the metal gate structure 120-2 of the second FinFET device 110-2 may include the IL 140, the high-k gate dielectric layer 142, a second work function metal layer 152 over the high-k gate dielectric layer 142, the first work function metal layer 150 over the second work function metal layer 152, the passivation layer 160 over the first work function metal layer 150, and the gap-filling metal layer 158. As mentioned above, the metal gate structure 120-2 may further include at least a barrier metal layer (not shown). For the p-type FinFET 110-2, one or more of TaN, TiN, TSN, Mo and WCN can be used as the second work function metal layer 152. Further, the second work function metal layer 152 can include a single layer or a multilayer of two or more of these materials, but is not limited to this. A thickness of the second work function metal layer 152 can be between approximately 1 nm and approximately 10 nm, but the disclosure is not limited thereto.

As shown in FIG. 2, the gate structure 120-3 of the third FinFET device 110-3 may include a metal gate structure. In some embodiments, the metal gate structure 120-3 of the third FinFET device 110-3 may include the IL 140, the high-k gate dielectric layer 142, a third work function metal layer 154 over the high-k gate dielectric layer 142, the first work function metal layer 150 over the third work function metal layer 154, the passivation layer 160 over the first work function metal layer 150, and the gap-filling metal layer 158. As mentioned above, the metal gate structure 120-3 may further include at least a barrier metal layer (not shown). For the p-type FinFET 110-3, one or more of TaN, TiN, TSN, Mo and WCN can be used as the third work function metal layer 154. Further, the third work function metal layer 154 can include a single layer or a multilayer of two or more of these materials, but is not limited to this. In some embodiments, the second work function metal layer 152 and the third work function metal layer 154 can include a same material. In some alternative embodiments, the second work function metal layer 152 and the third work function metal layer 154 can include different materials. A thickness of the third work function metal layer 154 can be between approximately 1 nm and approximately 10 nm, but the disclosure is not limited thereto. In some embodiments, the thickness of the third work function metal layer 154 is greater than the thickness of the second work function metal layer 152, but the disclosure is not limited thereto.

As shown in FIG. 2, the gate structure 120-4 of the nanosheet FET device 110-4 may include a metal gate structure. In some embodiments, the metal gate structure 120-4 of the nanosheet FinFET device 110-4 may include the IL 140, the high-k gate dielectric layer 142, a fourth work function metal layer 156 over the high-k gate dielectric layer 142, a passivation layer 162 over the fourth work function metal layer 156, the third work function metal layer 154 over the passivation layer 162, the first work function metal layer 150 over the third work function metal layer 154, the passivation layer 160 over the first work function metal layer 150, and the gap-filling metal layer 158. As mentioned above, the metal gate structure 120-4 may further include at least a barrier metal layer (not shown). For the n-type nanosheet FET device 110-4, one or more of TiAl, TiAlC, TiAl(Si)C, TaAlC, and TaSiAlC can be used as the fourth work function metal layer 156. Further, the fourth work function metal layer 156 can include a single layer or a multilayer of two or more of these materials, but is not limited to this. In some embodiments, the first work function metal layer 150 and the fourth work function metal layer 156 can include a same material. In some alternative embodiments, the first work function metal layer 150 and the fourth work function metal layer 156 can include different materials. A thickness of the fourth work function metal layer 156 can be between approximately 1 nm and approximately 5 nm, but the disclosure is not limited thereto.

It should be noted that the IL 140, the high-k gate dielectric layer 142, the fourth work function metal layer 156 and passivation layer 162 surround and enclose each of the nanosheets 132, as shown in FIG. 2, such that a gate-all-around (GAA) approach is obtained. In some embodiments, the third work function metal layer 154, the first work function metal layer 150 and the gap-filling metal layer 158 may be disposed over the nanosheet stack 130-4, as shown in FIG. 2.

According to the provided semiconductor structure 100, different Vt can be obtained by providing the n-type and p-type FinFET devices 110-1, 110-2 and 110-3 and the nanosheet FET device 110-4. In some embodiments, for the core or logic circuit, the Vt of the first FinFET device 110-1 can be adjusted by selecting the material and thickness of the first work function metal layer 150. The Vt of the second FinFET device 110-2 can be adjusted by selecting the material an thickness of the second work function metal layer 152. For the memory circuit, the Vt of the third FinFET device 110-3 can be adjusted by selecting the material and thickness of the third work function metal layer 154. Therefore, the Vt adjustments of each of the FinFET devices 110-1, 110-2 and 110-3 can be independently achieved.

In contrast to the Vt of the FinFET devices, the Vt of the nanosheet FET device 110-4 can be adjusted by modifying the width W of each nano-sheet 132, the thickness T of each nano-sheet 132, and the material of the fourth work function metal layer 156. It should be noted that Vts of the first, second and third FinFET devices 110-1, 110-2 and 110-3 can be adjusted by selecting the thickness and materials of the work function metal layers. But for a pull-down device in the memory circuit, which needs to have a customized Vt, the selecting of materials may not be sufficient. Therefore, the nanosheets 132 provide an approach to adjusting the Vt. By using the nanosheets 132 and selecting the materials for the fourth work function metal layer 156, the Vt of the pull-down device can be adjusted to meet the requirement without impacting other devices.

Figure 3:
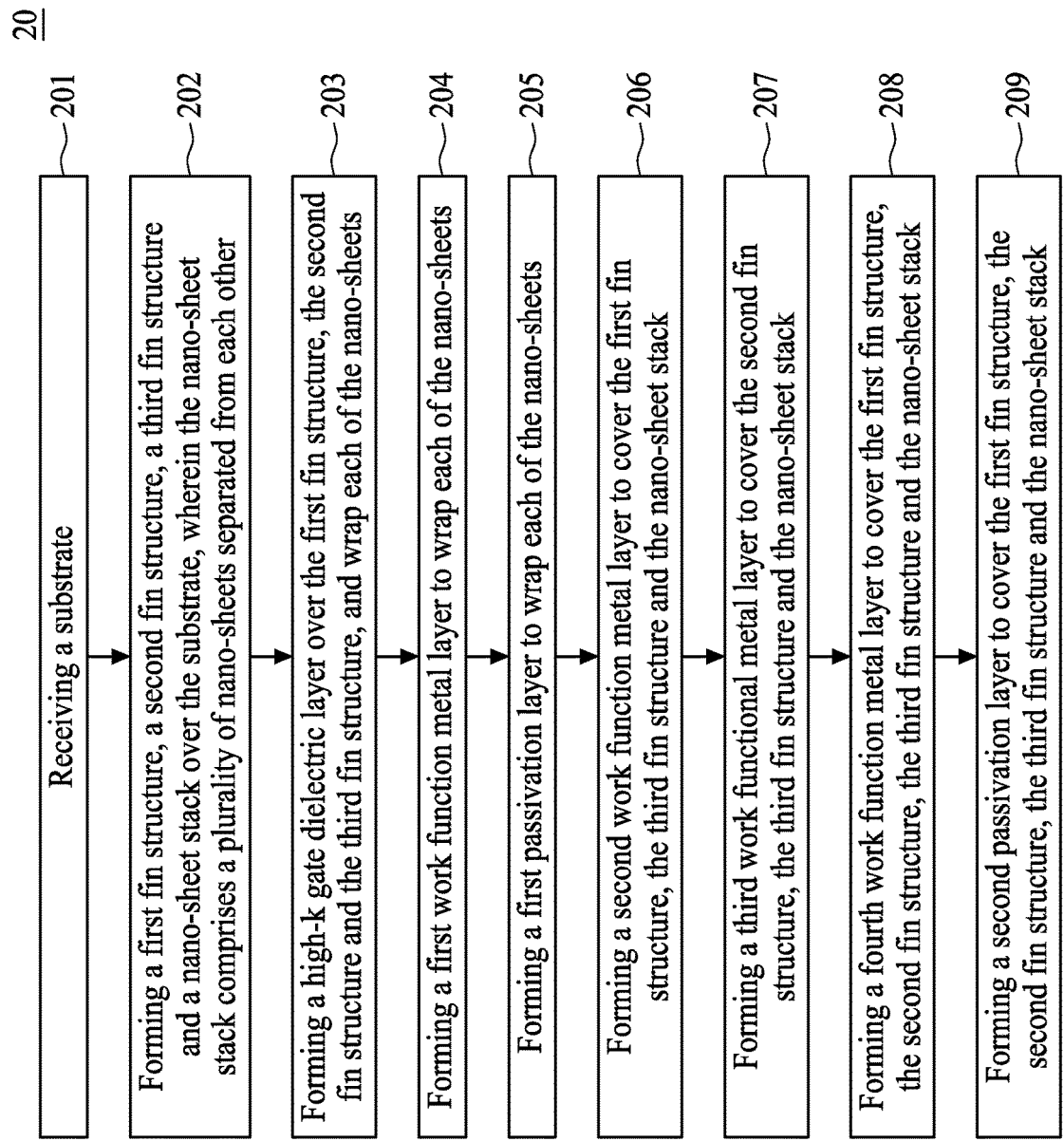
FIG. 3 is a flowchart representing a method for forming a semiconductor structure according to aspects of the present disclosure.

FIG. 3 is a flowchart representing a method for forming a semiconductor structure 20 according to aspects of the present disclosure. The method 20 includes a number of operations (201, 202, 203, 204, 205, 206, 207, 208 and 209). The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

Figure 4:
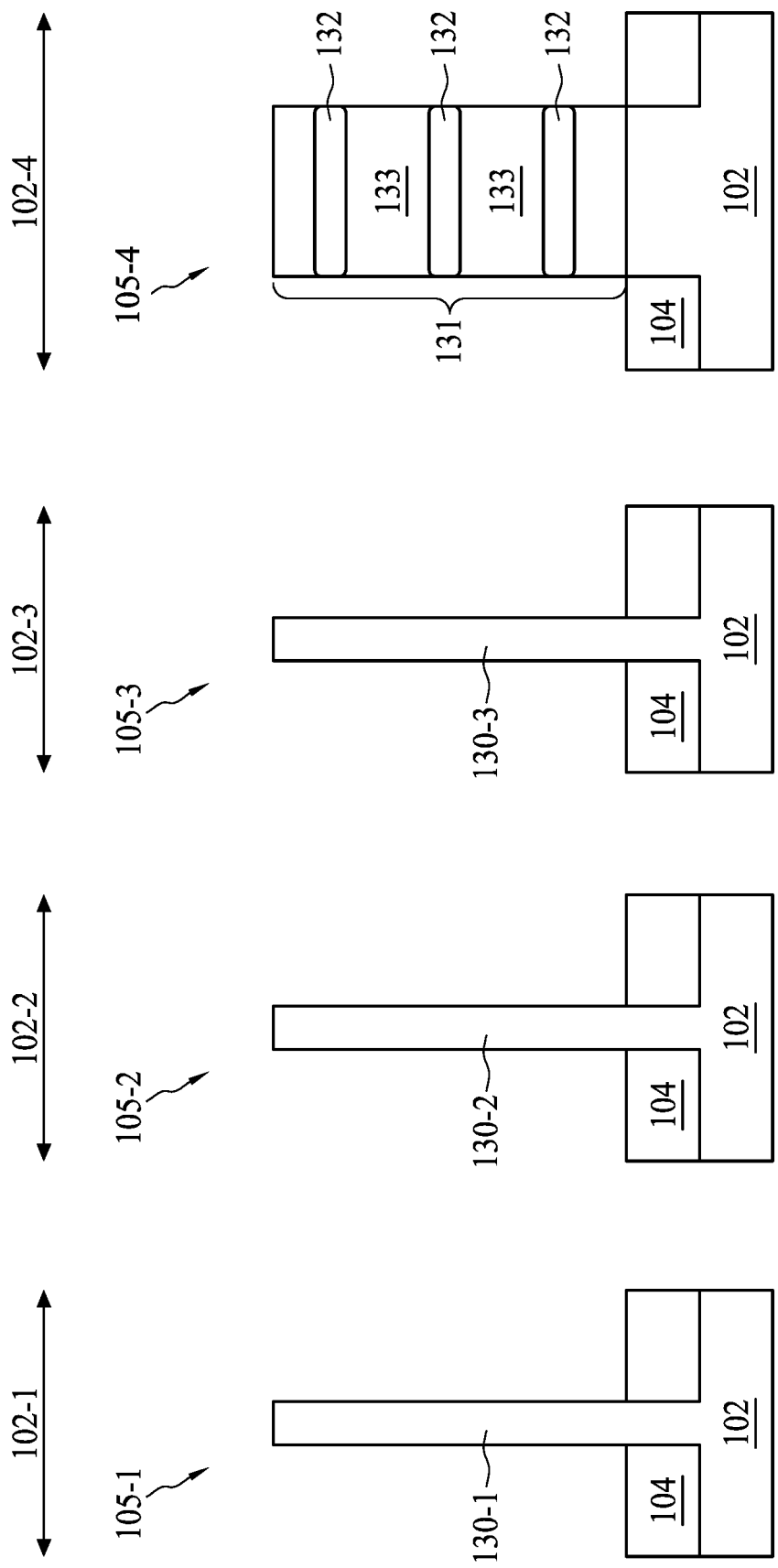
FIGS. 4 to 16 are schematic drawings of a semiconductor structure in various stages of a method for forming a semiconductor structure according to aspects of the present disclosure.

At operation 201, a substrate 102 is received. In some embodiments, the substrate 102 can be defined as including a first region 102-1, a second region 102-2, a third region 102-3 and a fourth region 102-4, as shown in FIG. 4. The different regions 102-1 to 102-4 are defined to accommodate different devices. In some embodiments, each of the first to fourth regions 102-1 to 102-4 can have similar area. However, in other embodiments, the first to fourth regions 102-1 to 102-4 can have different areas. For example, the fourth region 102-4 may have an area greater than those of the first, second and third regions 102-1, 102-2 and 102-3, but the disclosure is not limited thereto.

Figure 5:
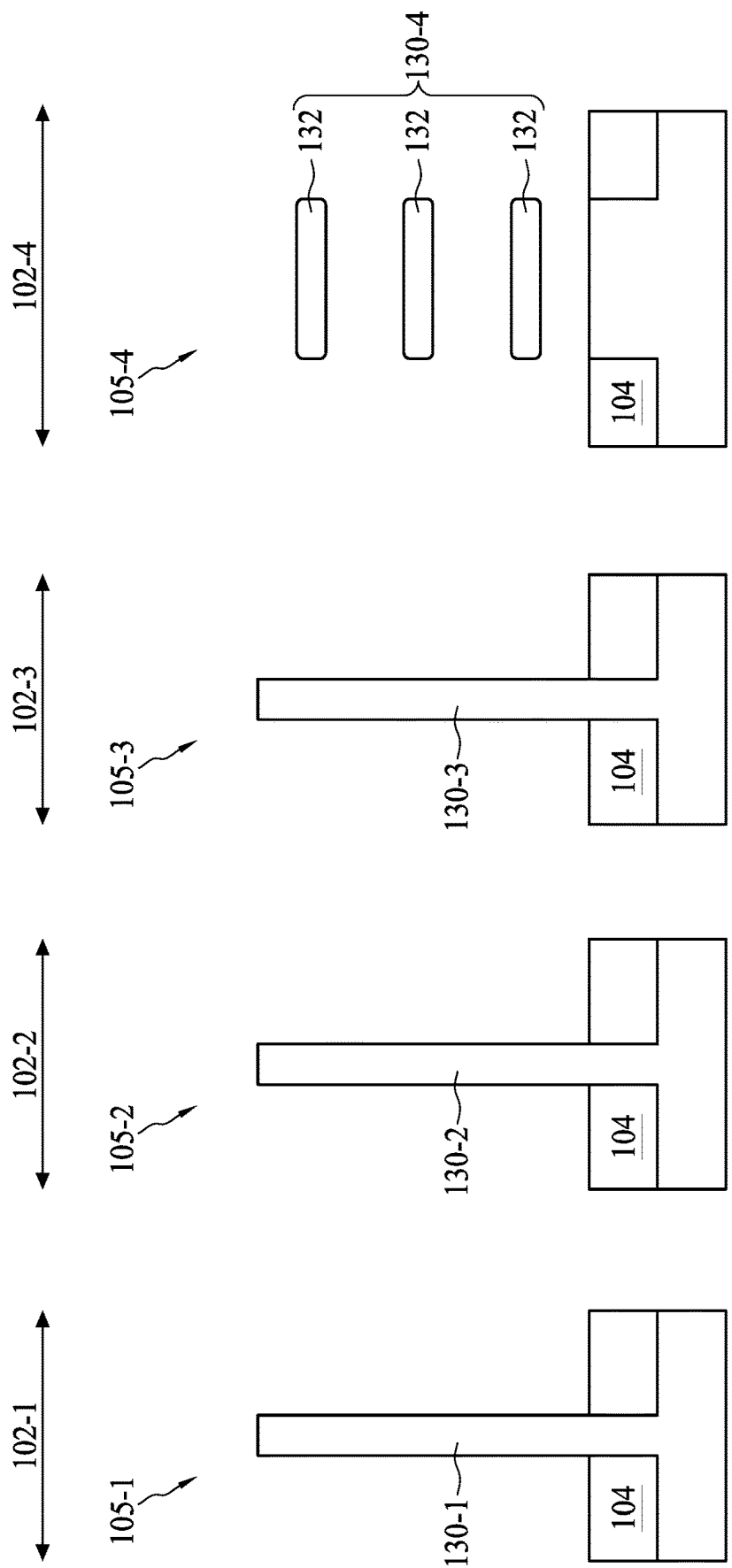

In operation 202, a first fin structure 130-1, a second fin structure 130-2, a third fin structure 130-3 and a nanosheet stack 130-4 are formed over the substrate 102. As shown in FIG. 5, the first fin structure 130-1 is formed in the first region 102-1, the second fin structure 130-2 is formed in the second region 102-2, the third fin structure 130-3 is formed in the third region 102-3, and the nanosheet stack 130-4 is formed in the fourth region 102-4. Further, the nano sheet stack 130-4 includes a plurality of nano sheets 132 separated from each other.

In some embodiments, fully-strained channels can be used to improve carrier mobility and reduce channel resistance of the device. The materials used in the strained channels for a p-type FET device can be different from those used in the strained channels for an n-type FET device. By way of example and not limitation, electron mobility in an NFET can be enhanced with the use of fully-strained silicon/carbon-doped silicon (Si/Si:C) channels, while hole mobility in PFETs can be enhanced with fully strained silicon germanium (SiGe) channels. In some embodiments, the first fin structure 130-1 can include Si/Si:C, and the second and third fin structures 130-2 and 130-3 can include SiGe, but the disclosure is not limited thereto. In some embodiments, the fully-strained epitaxial channels can be formed from epitaxial layers disposed on a top portion of a silicon (Si) fin. The formation process of fully-strained channels requires numerous photolithography, etch, pre-treatment, anneal and growth operations, and description of such operations are omitted herein in the interest of brevity.

In contrast to the first, second and third fin structures 130-1, 130-2 and 130-3, the nanosheet stack 130-4 is formed by different operations. In some embodiments, a plurality of material layers 132 and a plurality of dummy layers 133 are alternately formed over the substrate 102 in the fourth region 102-4. In some embodiments, a thickness of the material layer 132 can be between approximately 4 nm and approximately 10 nm, but the disclosure is not limited thereto. In some embodiments, a thickness of the dummy layer 133 may be greater than the thickness of the material layer 132 in order to leave enough space for gate formation. A patterning operation may be performed to form a fourth fin structure 131 in the fourth region 102-4. In contrast to the first, second and third fin structures 130-1, 130-2 and 130-3, the fourth fin structure 131 is a stacked structure including the alternately arranged material layers 132 and dummy layers 133. In some embodiments, a width of the fourth fin structure 131 can be between approximately 10 nm and approximately 5 nm, but the disclosure is not limited thereto.

In some embodiments, sacrificial gate structures (not shown) can be formed to cover a portion of each of the first to fourth fin structures 130-1, 130-2, 130-3 and 131. In some embodiments, spacers (not shown) can be formed over sidewalls of the sacrificial gate structures. In some embodiments, the spacers are made of silicon nitride (SiN), silicon carbide (SiC), SiO, silicon oxynitride (SiON), silicon carbon or any suitable material, but the disclosure is not limited thereto. In some embodiments, the spacers are formed by deposition and etch back operations.

Next, source/drain structures 122-1 and 124-2 are formed over the first fin structure 130-1 at two opposite sides of the sacrificial gate structure in accordance with some embodiments. Similarly, source/drain structures 122-2 and 124-2 are formed over the second fin structure 130-2 at two opposite sides of the sacrificial gate structure, and source/drain structures 122-3 and 124-3 are formed over the third fin structure 130-3 at two opposite sides of the sacrificial gate structure, as shown in FIG. 1. In some embodiments, source/drain structures 122-4 and 124-4 are formed over the fourth fin structure 131 at two opposite sides of the sacrificial gate structure. In some embodiments, the source/drain structures can be relatively higher than the height of fin structures 130-1, 130-2, 130-3 and 131. In some embodiments, the source/drain structures may be formed by forming recesses in the fin structures and growing a strained material in the recesses by an epitaxial (epi) process. In addition, the lattice constant of the strained material may be different from the lattice constant of the substrate 102. Accordingly, the source/drain structures serve as stressors that improve carrier mobility.

In some embodiments, after the forming of the source/drain structures, a contact etch stop layer (CESL) (not shown) can be formed to cover the sacrificial gate structures over the substrate 102. In some embodiments, the CESL can include silicon nitride, silicon oxynitride, and/or other applicable materials. Subsequently, an inter-layer dielectric (ILD) layer (not shown) can be formed on the CESL over the substrate 102 in accordance with some embodiments. The ILD layer may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Next, a polishing process is performed on the ILD layer and the CESL to expose top surfaces of the sacrificial gate structures. In some embodiments, the ILD layer and the CESL are planarized by a chemical mechanical polishing (CMP) process until the top surfaces of the sacrificial gate structures are exposed.

After the exposing of the top surfaces of the sacrificial gate structures, the sacrificial gate structures are removed to form a first gate trench 105-1 in the first region 102-1, a second gate trench 105-2 in the second region 102-2, a third gate trench 105-3 in the third region 102-3, and a fourth gate trench 105-4 in the fourth region 102-4. Accordingly, the first fin structure 130-1 is exposed through the first gate trench 105-1, the second fin structure 130-2 is exposed through the second gate trench 105-2, the third fin structure 130-3 is exposed through the third gate trench, and the fourth fin structure 131 is exposed through the fourth gate trench 105-4, as shown in FIG. 4.

Referring to FIG. 5, in some embodiments, a protecting layer may be formed to cover the first region 102-1, the second region 102-2 and the third region 102-3. Subsequently, the dummy layers 133 in the fourth fin structure 131 are removed. Accordingly, a nanosheet stack 130-4 including a plurality of nanosheets 132 stacked over the substrate 102 is formed, wherein the nanosheets 132 are separated from each other, as shown in FIG. 5. A width of each nanosheet 132 is substantially the same as the width of the fourth fin structure. In some embodiments, by adjusting the width of the fourth fin structure (and consequently the width of each nanosheet 132) and adjusting a thickness of the material layer (and consequently the thickness of each nanosheet 132), Vt of the FET device to be formed can be adjusted to meet the requirement.

Figure 6:
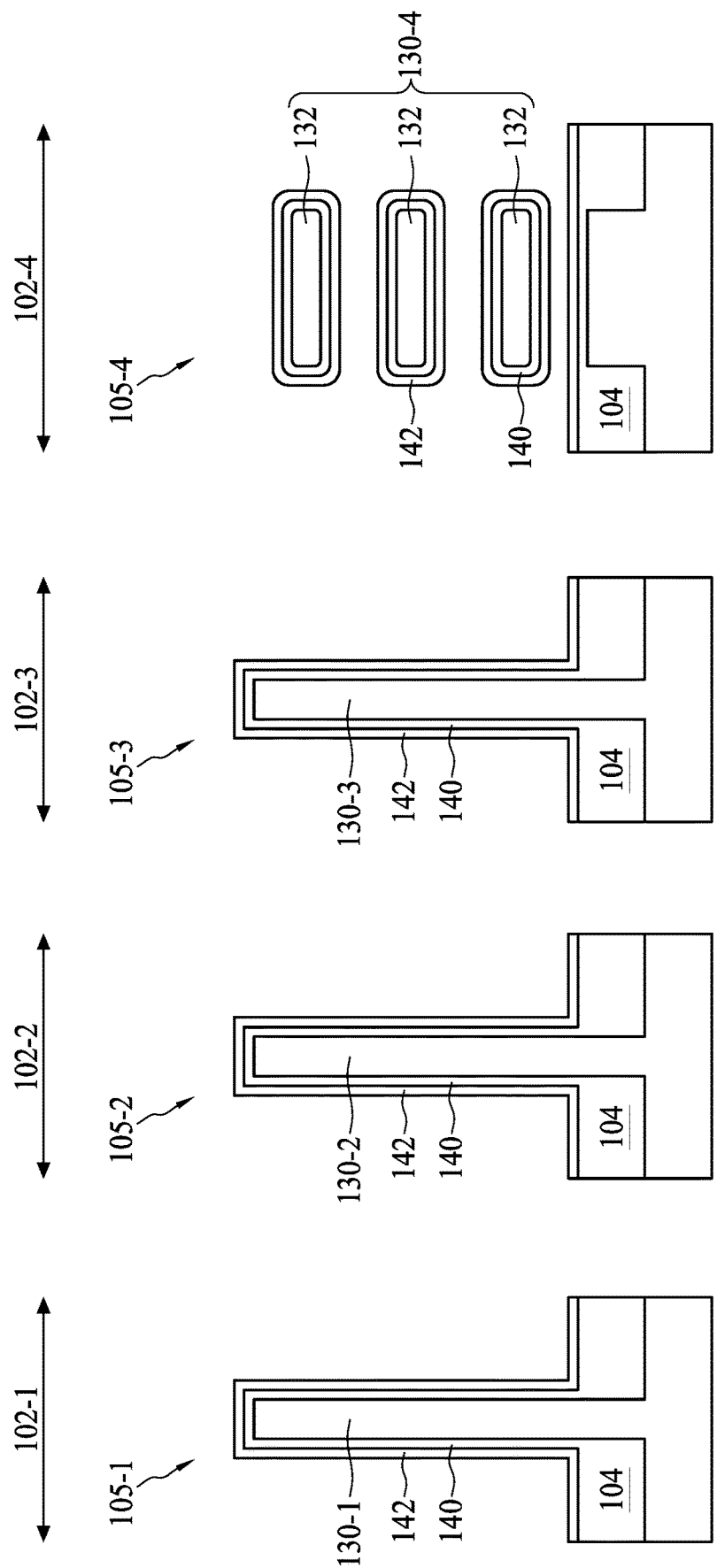

Referring to FIG. 6, an IL 140 is formed to cover the first fin structure 130-1 exposed through the first gate trench 105-1, the second fin structure 130-2 exposed through the second gate trench 105-2 and the third fin structure 130-3 exposed through the third gate trench 105-3. The IL 140 also surrounds each of the nanosheets 132 exposed in the fourth gate trench 105-4. After the forming of the IL, a high-k gate dielectric layer 142 is formed over the first fin structure 130-1, the second fin structure 130-2 and the third fin structure 130-3 and the nanosheets 132 in operation 203. Further, the high-k gate dielectric layer 142 surrounds and encloses each of the nano-sheets 132.

Figure 7:
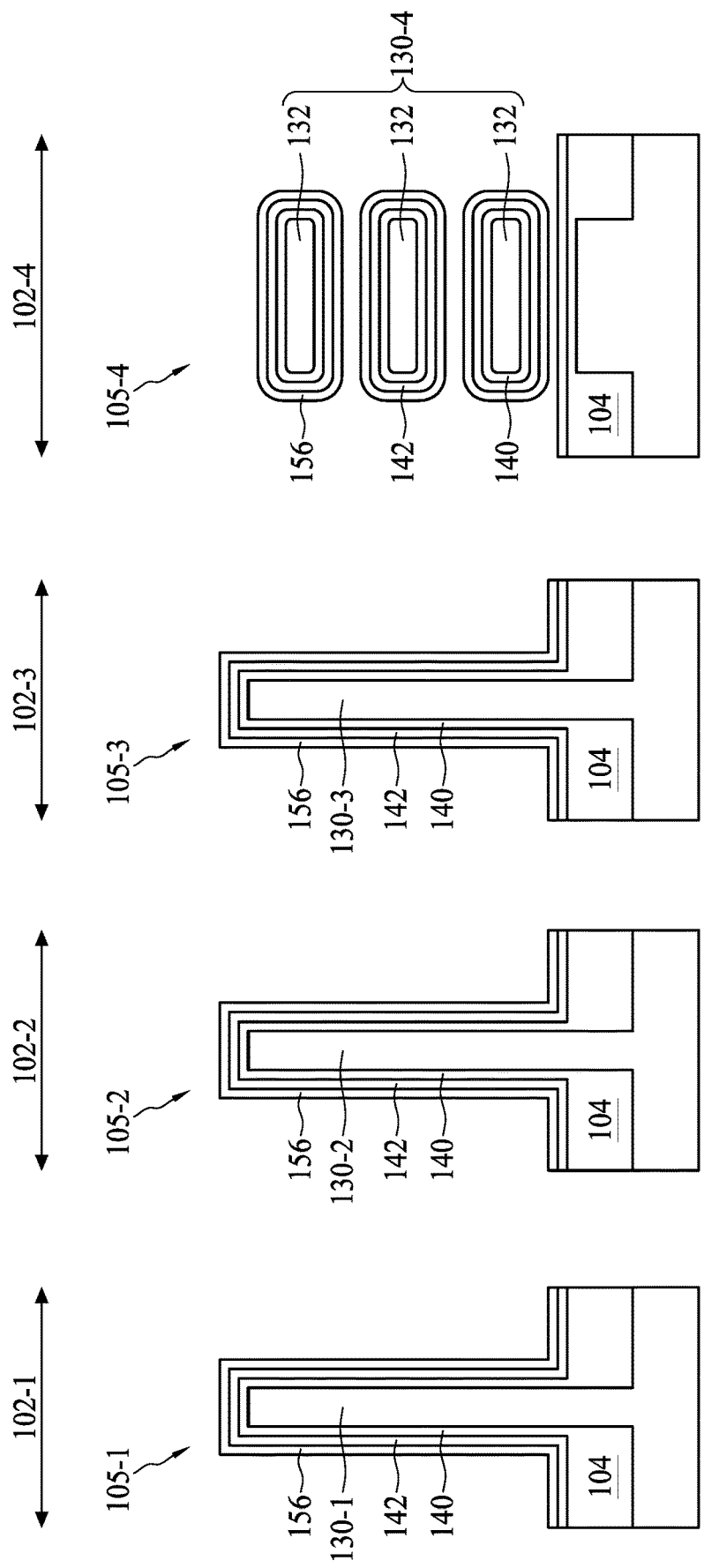

At operation 204, a work function metal layer 156 is formed to surround each of the nanosheets 132. Referring to FIG. 7, the work function metal layer 156 is formed on the high-k gate dielectric layer 142. In some embodiments, the work function metal layer 156 is an n-type work function metal layer. By selecting the metal material and adjusting a thickness of the work function metal layer 156, Vt of the n-type FET device to be formed in the fourth region 102-4 can be adjusted to meet the requirement. As shown in FIG. 7, the work function metal layer 156 may cover the first fin structure 130-1, the second fin structure 130-2 and the third fin structure 130-3. Further, the work function metal layer 156 surrounds and encloses each of the nanosheets 132.

Figure 8:
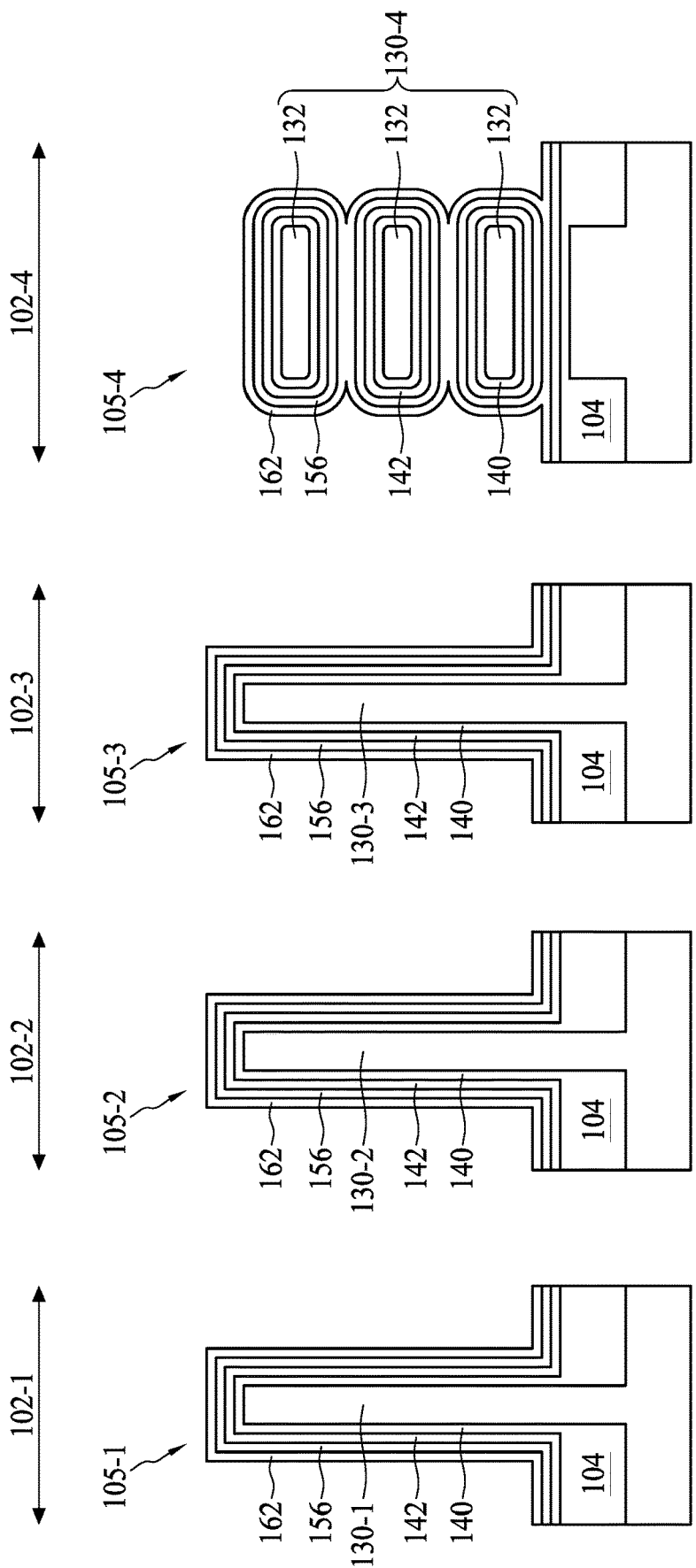

At operation 205, a passivation layer 162 is formed over the work function metal layer 156. As shown in FIG. 8, the passivation layer 162 may cover the first fin structure 130-1, the second fin structure 130-2 and the third fin structure 130-3. Further, the passivation layer 162 surrounds and encloses each of the nanosheets 132.

Figure 9:
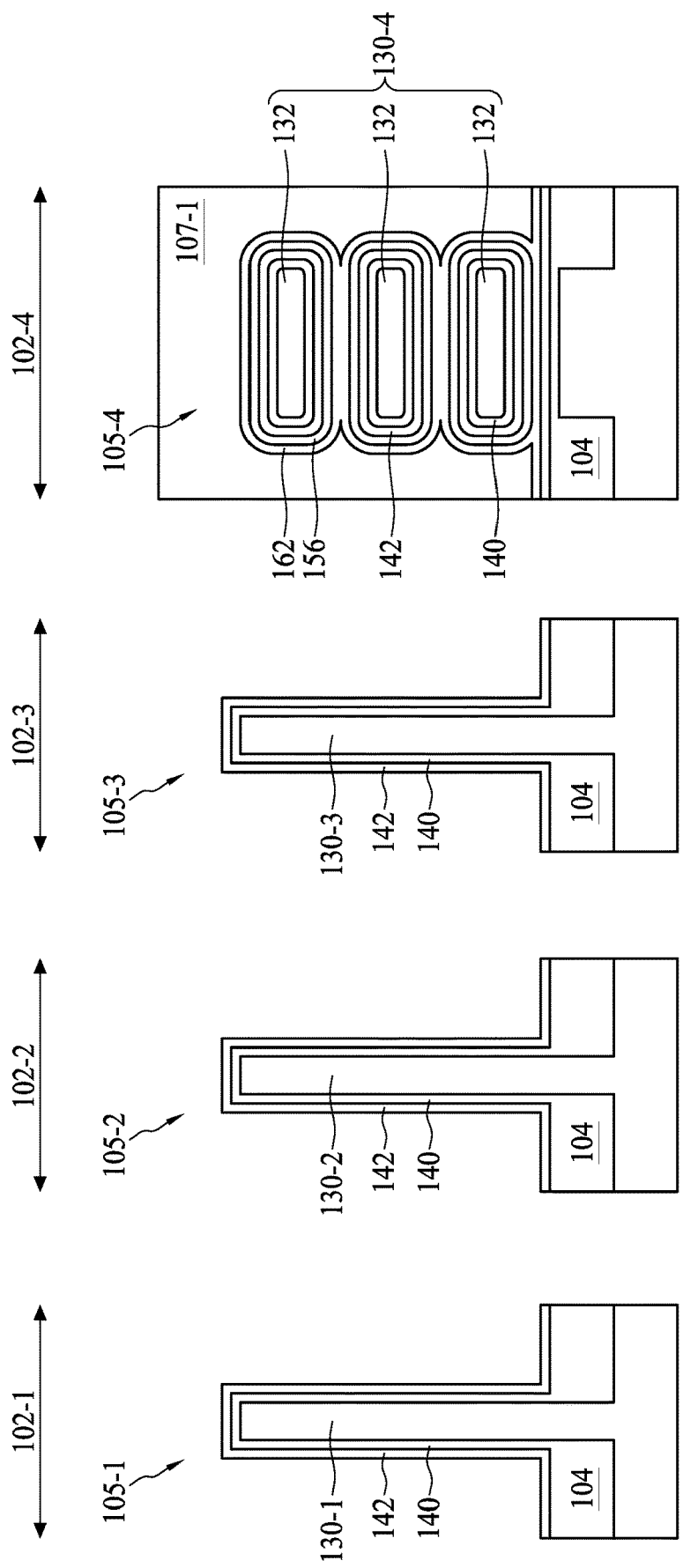

Referring to FIG. 9, in some embodiments, a protecting layer 107-1 is formed in the fourth region 102-4. Subsequently, etching operations can be performed to remove portions of the passivation layer 162 and portions of the work function metal layer 156 from the first gate trench 105-1, the second gate trench 105-2 and the third gate trench 105-3. Accordingly, the high-k gate dielectric layer 142 over the first fin structure 130-1 is exposed through the first gate trench 105-1, the high-k gate dielectric layer 142 over the second fin structure 130-2 is exposed through the second gate trench 105-2, and the high-k gate dielectric layer 142 over the third fin structure 130-3 is exposed through the third gate trench 105-3. Accordingly, the work function metal layer 156 is left only in the fourth gate trench 105-4 and surrounds each of the nanosheets 132, as shown in FIG. 9. After the removing of the portions of the passivation layer 162 and the portions of the work function metal layer 156 from the first gate trench 105-1, the second gate trench 105-2 and the third gate trench 105-3, the protecting layer 107-1 can be removed.

Figure 10:
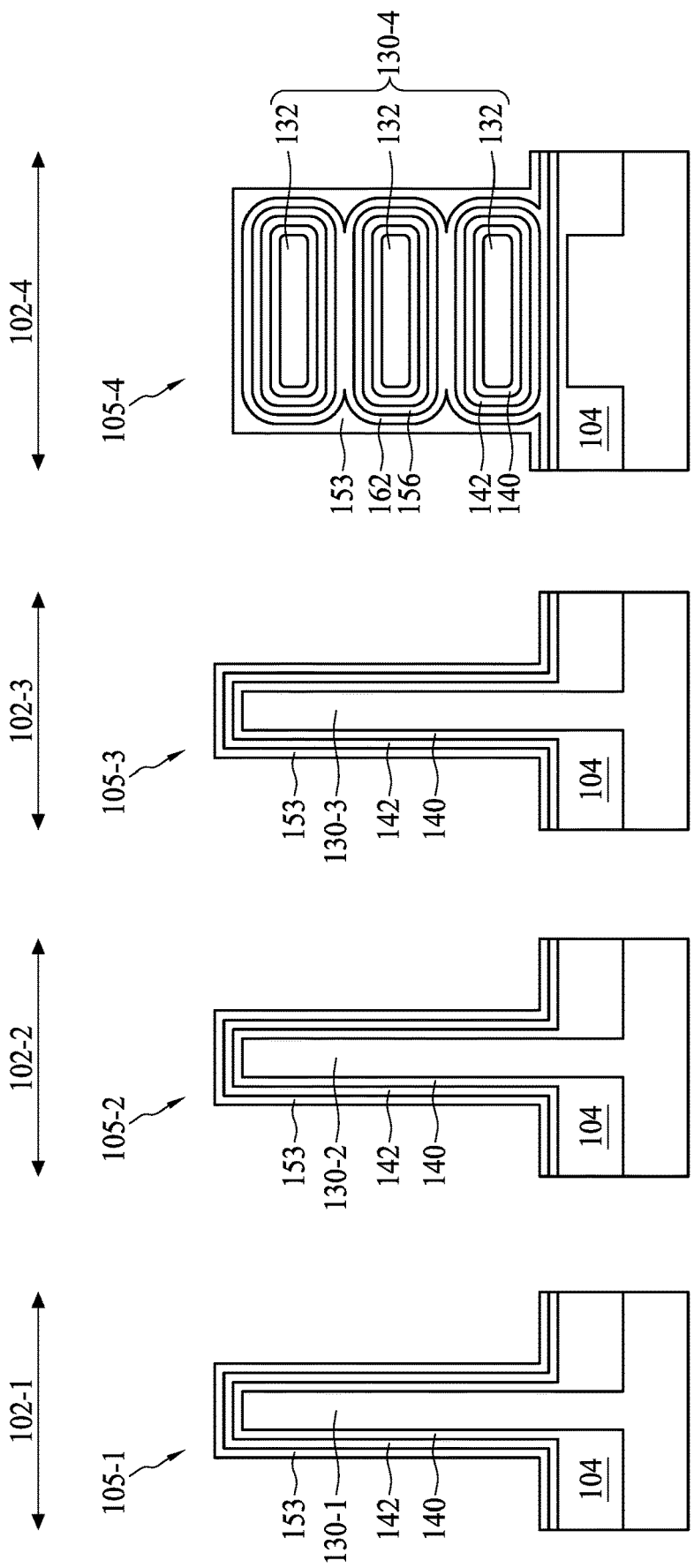

In some embodiments, a work function metal layer 153 is formed over the high-k gate dielectric layer 142 over the first fin structure 130-1, over the high-k gate dielectric layer 142 over the second fin structure 130-2, over the high-k gate dielectric layer 142 over the third fin structure 130-3, and over the passivation layer 162 over the nanosheet stack 130-4. As shown in FIG. 10, the work function metal layer 153 may cover the first fin structure 130-1, the second fin structure 130-2, the third fin structure 130-3 and the nanosheet stack 130-4. In some embodiments, the work function metal layer 153 is a p-type work function metal layer.

Figure 11:
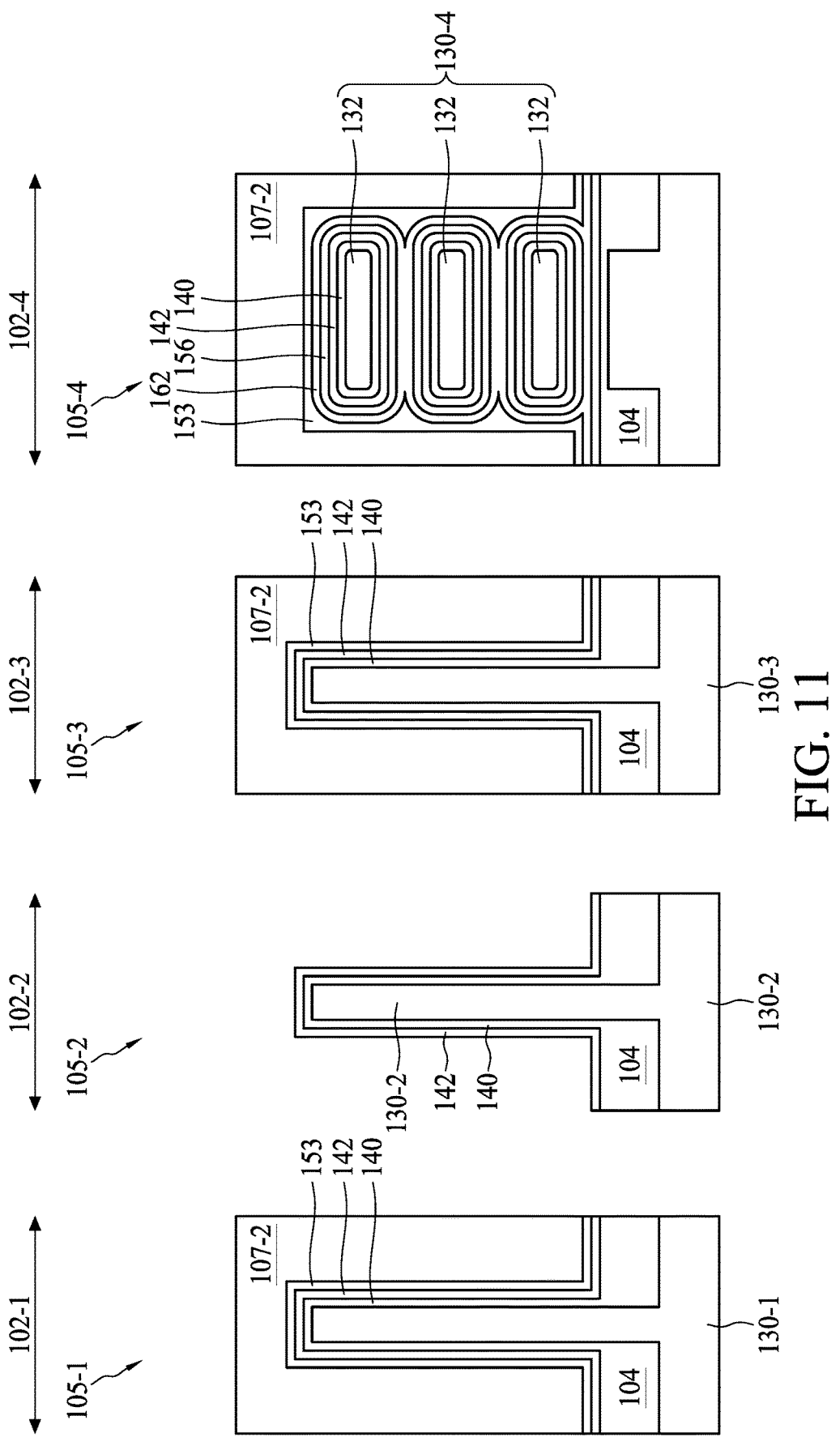

Referring to FIG. 11, in some embodiments, a protecting layer 107-2 is formed in the first region 102-1, the third region 102-3 and the fourth region 102-4. Subsequently, an etching operation can be performed to remove a portion of the work function metal layer 153 from the second gate trench 105-2. Accordingly, the high-k gate dielectric layer 142 over the second fin structure 130-2 is exposed through the second gate trench 105-2 again. Accordingly, the work function metal layer 153 is left in first gate trench 105-1, the third gate trench 105-3 and the fourth gate trench 105-4, as shown in FIG. 11. After the removing of the portions of the work function metal layer 153, the protecting layer 107-2 can be removed. Accordingly, the work function metal layer 153 is formed to cover the first fin structure 130-1, the third fin structure 130-3 and the nanosheet stack 130-4, at operation 206.

Figure 12:
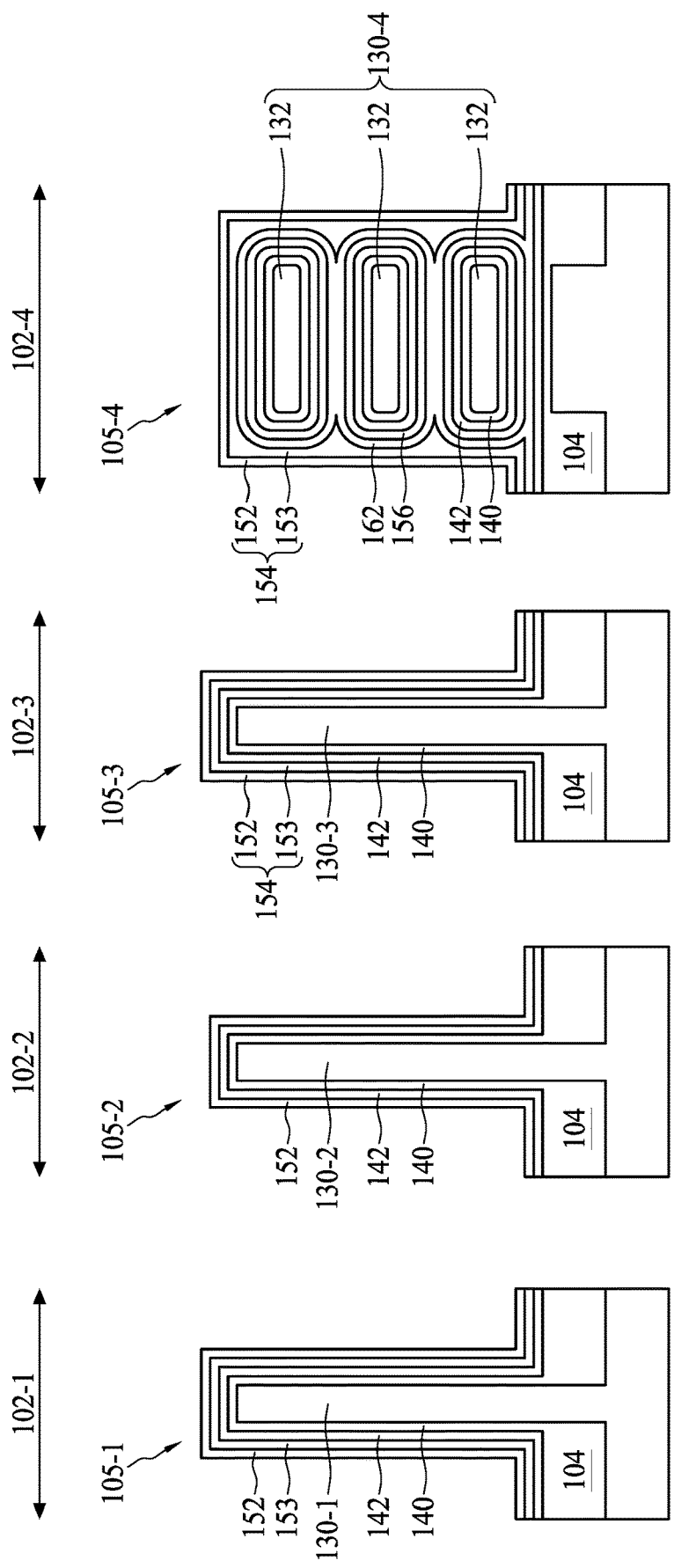

In some embodiments, a work function metal layer 152 is formed over the work function metal layer 153 over the first fin structure 130-1, over the high-k gate dielectric layer 142 over the second fin structure 130-2, over the work function metal layer 153 over the third fin structure 130-3, and over the work function metal layer 153 over the nano-sheet stack 130-4. As shown in FIG. 12, the work function metal layer 152 may cover the first fin structure 130-1, the second fin structure 130-2, the third fin structure 130-3 and the nanosheet stack 130-4. In some embodiments, the work function metal layer 152 is a p-type work function metal layer. In some embodiments, the work function metal layer 152 and the work function metal layer 153 can include a same material. In such embodiments, a thickness of the work function metal layer 152 and the work function metal layer 153 can be the same or different. In some alternative embodiments, the work function metal layer 152 and the work function metal layer 153 can include different materials.

It should be noted that because the work function metal layer 152 and the work function metal layer 153 are both p-type work function metal layers, the work function metal layer 152 and the work function metal layer 153 can work together and are referred to as a work function metal layer 154, as shown in FIG. 12. In some embodiments, Vt of the FET device to be formed in the second region 102-2 can be adjusted to meet the requirement by selecting the material to form the work function metal layer 152 and adjusting the thickness of the work function metal layer 152. It should be noted that even though the material and thickness of the work function metal layer 152 are limited due to the Vt requirement for the FET device in the second region 102-2, Vt of the FET device to be formed in the third region 102-3 can be adjusted to meet the requirement by selecting the material to form the work function metal layer 153 and adjusting the thickness of the work function metal layer 154.

Because a thickness of the work function metal layer 154 is a sum of the thickness of the work function metal layer 153 and the thickness of the work function metal layer 152, the thickness of the work function metal layer 154 can be adjusted by adjusting the thickness of the work function metal layer 153.

Figure 13:
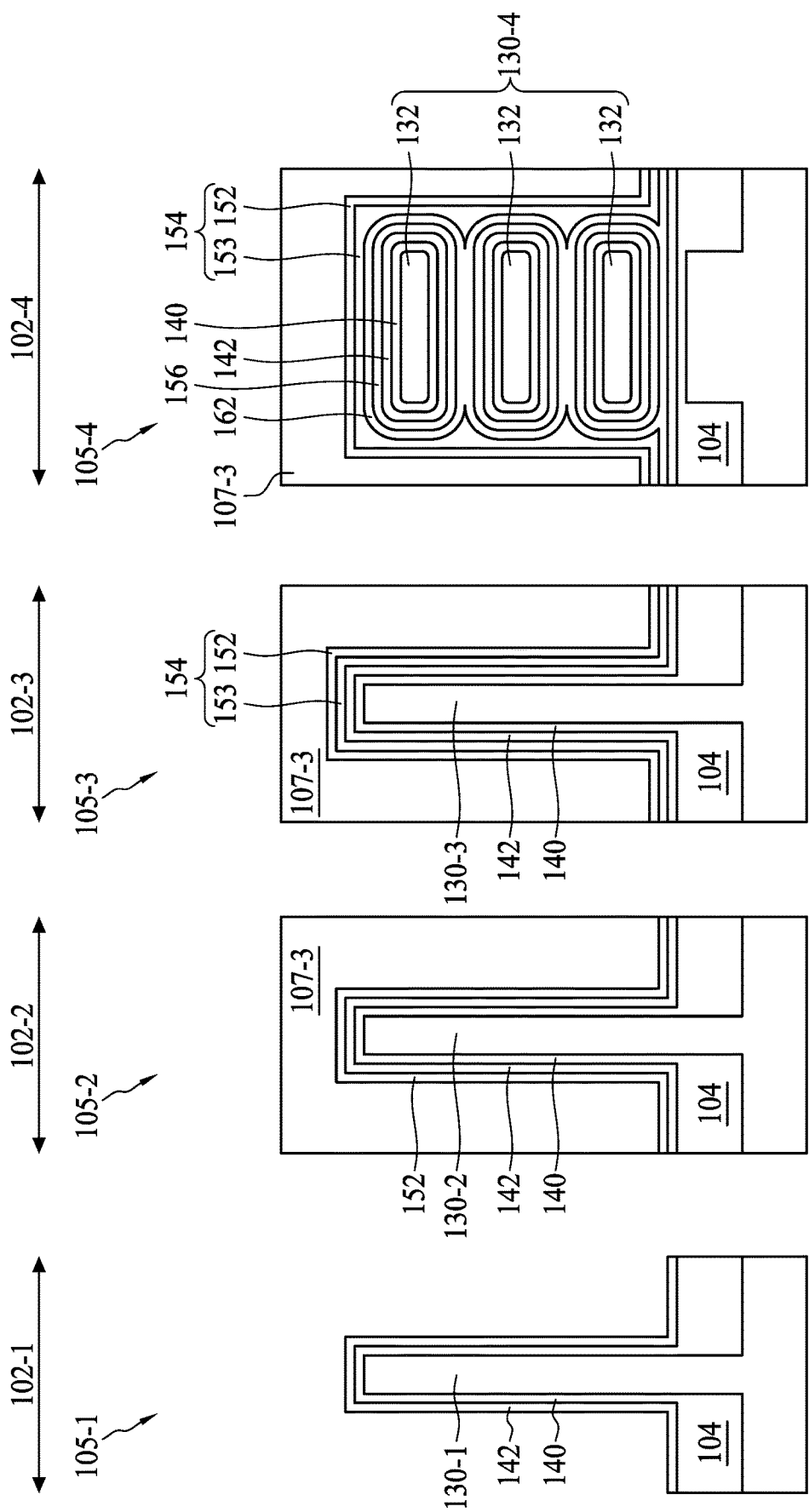

Referring to FIG. 13, in some embodiments, a protecting layer 107-3 is formed in the second region 102-2, the third region 102-3 and the fourth region 102-4. Subsequently, an etching operation can be performed to remove a portion of the work function metal layer 152 and a portion of the work function metal layer 153 from the first gate trench 105-1. Accordingly, the high-k gate dielectric layer 142 over the first fin structure 130-1 is exposed through the first gate trench 105-1 again. Accordingly, the work function metal layer 152 is left in the second gate trench 105-2 while the work function metal layer 154 is left in the third gate trench 105-3 and the fourth gate trench 105-4, as shown in FIG. 13. After the removing of the portion of the work function metal layer 152 and the portion of the work function metal layer 153, the protecting layer 107-3 can be removed. Accordingly, the work function metal layer 152 is formed to cover the second fin structure 130-1, the third fin structure 130-3 and the nanosheet stack 130-4, at operation 207.

Figure 14:
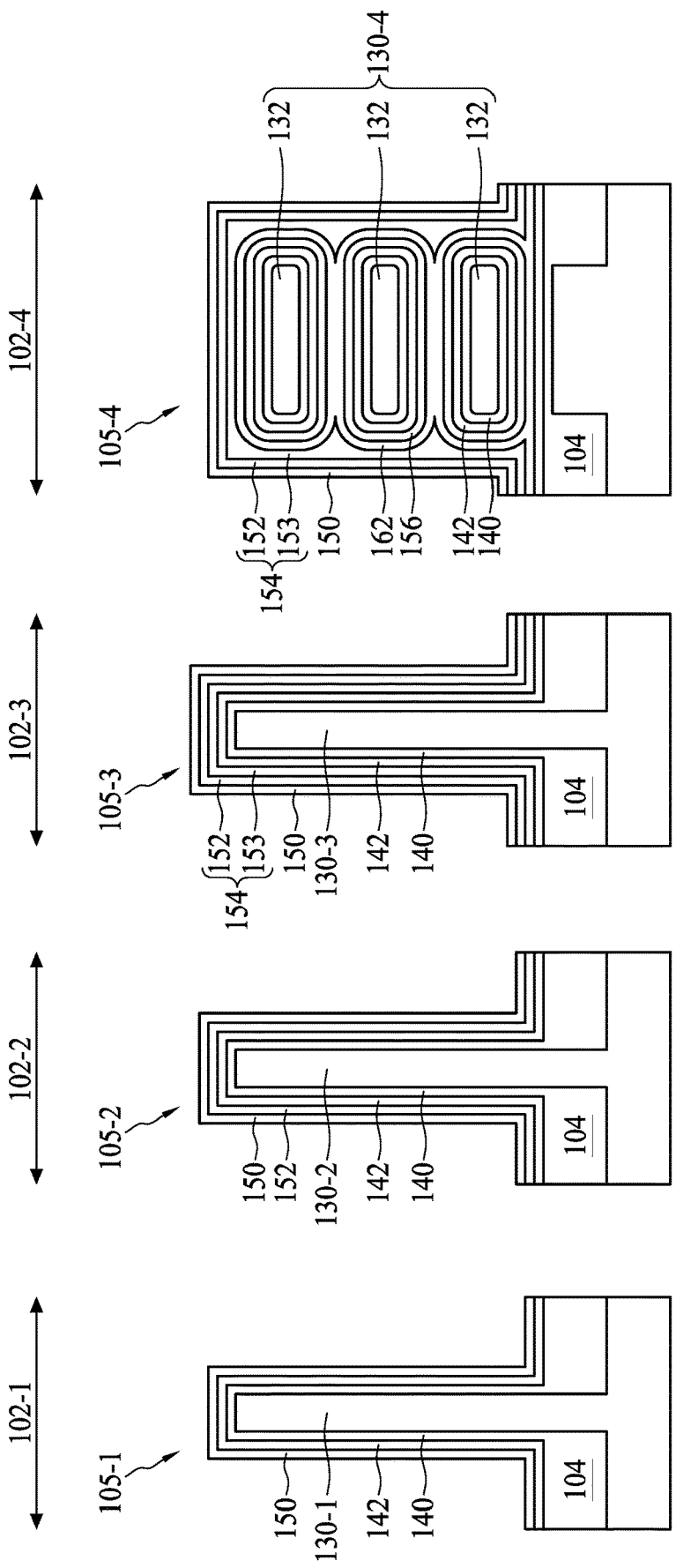

At operation 208, a work function metal layer 150 is formed to cover the first fin structure 130-1, the second fin structure 130-2, the third fin structure 130-3 and the nanosheet stack 130-4. As shown in FIG. 14, the work function metal layer 150 may be formed on the high-k gate dielectric layer 142 in the first gate trench 105-1. In some embodiments, the work function metal layer 150 is an n-type work function metal layer. By selecting the metal material and adjusting a thickness of the work function metal layer 150, Vt of the FET device to be formed in the first region 102-1 can be adjusted to meet the requirement. It should be noted that because the work function metal layer 150 and the work function metal layer 156 are both n-type work function metal layers. In some embodiments, the work function metal layer 150 and the work function metal layer 156 can include a same material. In such embodiments, a thickness of the work function metal layer 150 and a thickness of the work function metal layer 156 can be the same or different. In some alternative embodiments, the work function metal layer 150 and the work function metal layer 156 can include different materials. It should be noted that in the fourth gate trench 105-4, because the passivation layer 162 is formed between the work function metal layer 156 and other work function metal layers 154 and 150, the passivation layer 162 helps to obstruct metal diffusion to the work function metal layer 156.

Figure 15:
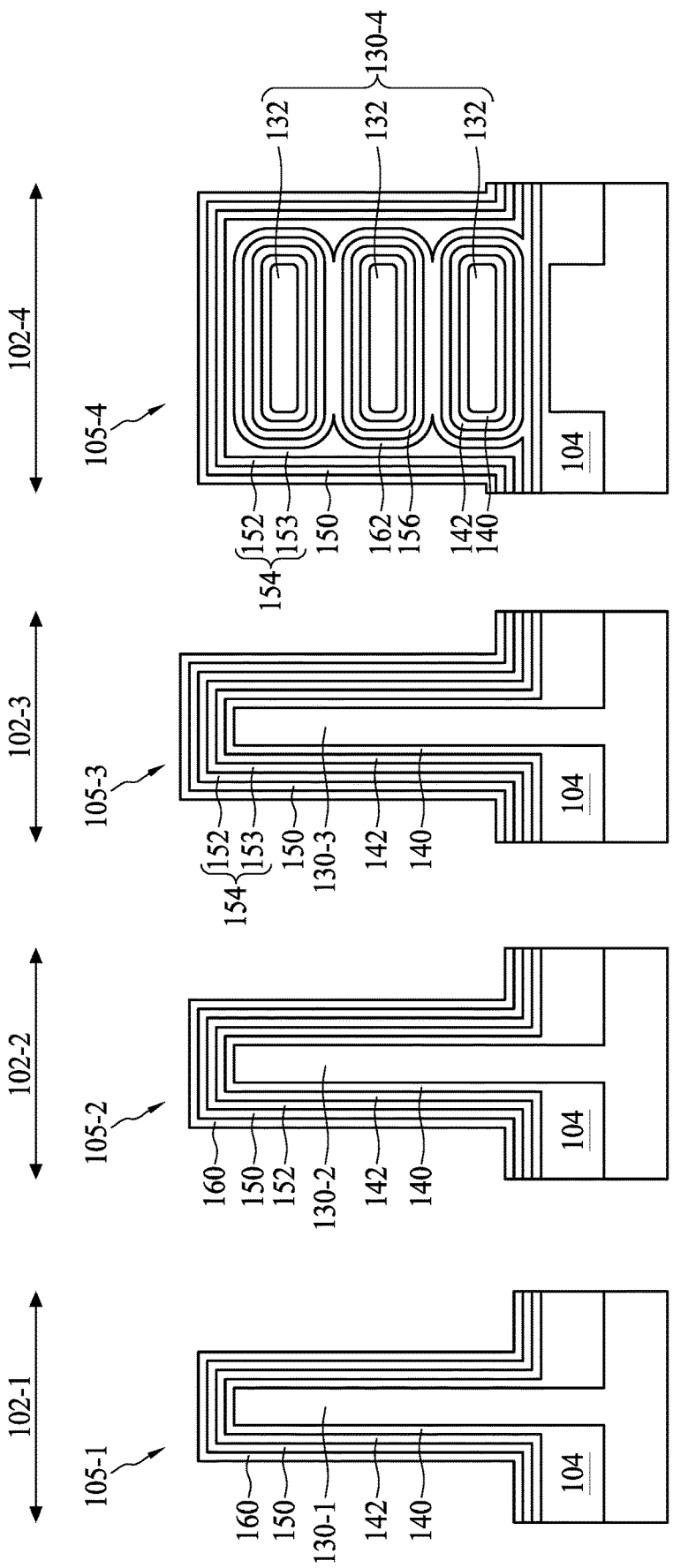

At operation 209, a passivation layer 160 is formed over the first fin structure 130-1, the second fin structure 130-2, the third fin structure 130-3 and the nanosheet stack 130-4, as shown in FIG. 15.

Figure 16:
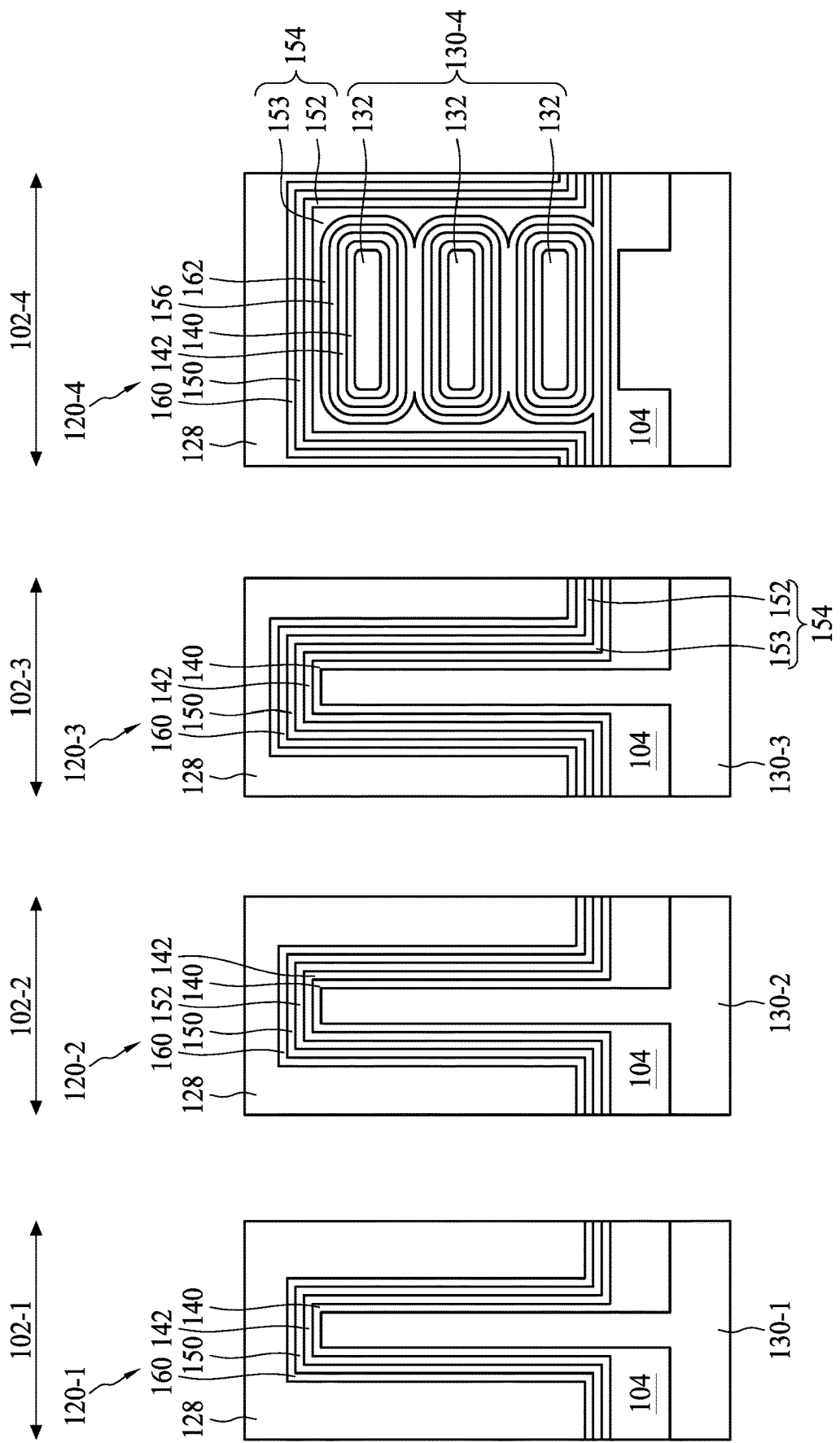

In some embodiments, a gap-filling metal layer 158 is formed to fill each of the first gate trench 105-1, the second gate trench 105-2, the third gate trench 105-3 and the fourth gate trench 105-4, as shown in FIG. 16.

Accordingly, a first metal gate structure 120-1 is formed in the first gate trench 105-1, and a first FinFET device 110-1 is formed in the first region 102-1. A second metal gate structure 120-2 is formed in the second gate trench 105-2, and a second FinFET device 110-2 is formed in the second region 102-2. A third metal gate structure 120-3 is formed in the third gate trench 105-3, and a third FinFET device 110-3 is formed in the third region 102-3. A fourth metal gate structure 120-4 is formed in the fourth gate trench 105-4 and a nanosheet FET device 110-4 is formed in the fourth region 102-4. In some embodiments, the first metal gate structure 120-1 is an n-type metal gate structure, and the first FinFET device 110-1 is an n-type FET device that can be used to form the core or logic circuit. The second metal gate structure 120-2 is a p-type metal gate structure, and the second FinFET device 110-2 is a p-typed FET device that can be used to form the core or logic circuit. The third metal gate structure 120-3 is a p-type metal gate structure, and the third FinFET device 110-3 is a p-type FET device that can be used to form the memory circuit. In some embodiments, the third FinFET device 110-3 can be a pull-up device in an SRAM memory circuit. The fourth metal gate structure 120-4 is an n-type metal gate structure, and the nanosheet FET device 110-4 is an n-type FET device that can be used to form the memory circuit. In some embodiments, the nanosheet FinFET device 110-4 can be a pull-down device in the SRAM memory circuit, such as an HC-SRAM memory circuit.

It will be appreciated that in the foregoing method, the FinFET devices and the nano-sheet FET are formed to meet different Vt requirements. As mentioned above, the nano-sheet FET device is an n-type FET device for an SRAM. In some embodiments, the work function metal layer and the width/thickness of the nanosheets can be adjusted or customized to meet the Vt requirement with less influence on other FinFET devices. Accordingly, performance of the n-type FET device can be improved, and the performance of the SRAM can be consequently, improved.

According to one embodiment of the present disclosure, a semiconductor structure is provided. The semiconductor structure includes a substrate including a first region and a second region, a first FET device disposed in the first region, and a second FET device disposed in the second region. The first FET device includes a fin structure, a first work function metal layer disposed over the fin structure, and a high-k gate dielectric layer between the first work function metal layer and the fin structure. The second FET device includes a plurality of nanosheets stacked over the substrate and separated from each other, a second work function metal layer surrounding each of the nanosheets, and the high-k gate dielectric layer between the second work function metal layer and each of the nanosheets. In some embodiments, the fin structure has a first width, each of the nanosheets has a second width, and the second width is greater than the first width.

According to one embodiment of the present disclosure, a semiconductor structure is provided. The semiconductor structure include includes a substrate having a first region, a second region, a third region and a fourth region, a first FinFET device disposed in the first region, a second FinFET device disposed in the second region, a third FinFET device disposed in the third region, and a nanosheet FET device disposed in the fourth region. The first FinFET device includes a first fin structure, a high-k gate dielectric layer over the first fin structure, and a first work function metal layer over the high-k gate dielectric layer. The second FinFET device includes a second fin structure, the high-k gate dielectric layer over the second fin structure, and a second work function metal layer over the high-k gate dielectric layer. The third FinFET device includes a third fin structure, the high-k gate dielectric layer over the third fin structure, and a third work function metal layer over the high-k gate dielectric layer. The nanosheet FET device includes a plurality of nanosheets stacked over the substrate, the high-k gate dielectric layer surrounding each of the nano sheets, and a fourth work function metal layer over the high-k gate dielectric layer and surrounding each of the nanosheets.

According to one embodiment of the present disclosure, a method for forming a semiconductor structure is provided. The method includes following operations. A substrate is received. A first fin structure, a second fin structure, a third fin structure and a nanosheet stack are formed over the substrate. The nanosheet stack includes a plurality of nanosheets separated from each other. A high-k gate dielectric layer is formed over the first fin structure, the second fin structure and the third fin structure, and surrounds each of the nanosheets. A first work function metal layer is formed to surround each of the nanosheets. A first passivation layer is formed to surround each of the nanosheets. A second work function metal layer is formed to cover the first fin structure, the third fin structure and the nanosheet stack. A third work function metal layer is formed to cover the second fin structure, the third fin structure and the nanosheet stack. A fourth work function metal layer is formed to cover the first fin structure, the second fin structure, the third fin structure and the nanosheet stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a substrate comprising a first region and a second region;
an isolation disposed in the substrate and separating the first region and the second region from each other;
a first field effect transistor (FET) device disposed in the first region, wherein the first FET device comprises:
a fin structure;
a first work function metal layer over the fin structure; and
a high-k gate dielectric layer between the first work function metal layer and the fin structure, wherein a portion of the high-k gate dielectric layer is directly over the isolation; and
a second FET device disposed in the second region, wherein the second FET device comprises:
a plurality of nanosheets stacked over the substrate and separated from each other;
a second work function metal layer surrounding each of the nanosheets; and
the high-k gate dielectric layer between the second work function metal layer and each of the nanosheets,
wherein the fin structure has a first width, each of the nanosheets has a second width, and the second width is greater than the first width.

2. The semiconductor structure of claim 1, wherein the first work function metal layer is a p-type work function metal layer, and the second work function metal layer is an n-type work function metal layer.

3. The semiconductor structure of claim 2, wherein the second FET device further comprises a third work function metal layer, and the third work function metal layer is a p-type work function metal layer.

4. The semiconductor structure of claim 3, wherein a thickness of the third work function metal layer is equal to or greater than a thickness of the first work function metal layer.

5. The semiconductor structure of claim 1, wherein the first work function metal layer and the second work function metal layer are n-type work function metal layers.

6. The semiconductor structure of claim 5, wherein the second FET device further comprises a fourth work function metal layer, and the fourth work function metal layer is same material as to the first work function metal layer.

7. The semiconductor structure of claim 1, wherein the high-k gate dielectric layer is in contact with the isolation.

8. A semiconductor structure, comprising:
a substrate having a first region, a second region, a third region and a fourth region defined thereon;
a first FinFET device disposed in the first region, wherein the first FinFET device comprises a first fin structure, a high-k gate dielectric layer over the first fin structure, and a first work function metal layer over the high-k gate dielectric layer;
a second FinFET device disposed in the second region, wherein the second FinFET device comprises a second fin structure, the high-k gate dielectric layer over the second fin structure, and a second work function metal layer over the high-k gate dielectric layer;
a third FinFET device disposed in the third region, wherein the third FinFET device comprises a third fin structure, the high-k gate dielectric layer over the third fin structure, and a third work function metal layer over the high-k gate dielectric layer; and
a nanosheet FET device disposed in the fourth region, wherein the nanosheet FET device comprises a plurality of nanosheets stacked over the substrate, the high-k gate dielectric layer surrounding each of the nanosheets, and a fourth work function metal layer over the high-k gate dielectric layer and surrounding each of the nanosheets.

9. The semiconductor structure of claim 8, wherein the first work function metal layer and the fourth work function metal layer are n-type work function metal layers.

10. The semiconductor structure of claim 9, wherein the first work function metal layer is different from the fourth work function metal layer.

11. The semiconductor structure of claim 10, wherein the nanosheet FET device further comprises a fifth work function metal layer, and the fifth work function metal layer and the first work function metal layer are the same.

12. The semiconductor structure of claim 8, wherein the second work function metal layer and the third work function metal layer are p-type work function metal layers.

13. The semiconductor structure of claim 12, wherein the second work function metal layer is different from the third work function metal layer.

14. The semiconductor structure of claim 12, wherein the nanosheet FET device further comprises a sixth work function metal layer, and the sixth work function metal layer and the third work function metal layer are the same.

15. The semiconductor structure of claim 12, wherein a crystal plane of each of the nanosheets is a (100) plane.

16. A method for forming a semiconductor structure comprising:
receiving a substrate;
forming a first fin structure, a second fin structure, a third fin structure and a nanosheet stack over the substrate, wherein the nanosheet stack comprises a plurality of nanosheets separated from each other;

forming a high-k gate dielectric layer over the first fin structure, the second fin structure and the third fin structure, and surrounding each of the nanosheets;

forming a first work function metal layer to surround each of the nanosheets;

forming a first passivation layer to wrap each of the nanosheets;

forming a second work function metal layer to cover the first fin structure, the third fin structure and the nanosheet stack;

forming a third work function metal layer to cover the second fin structure, the third fin structure and the nanosheet stack; and forming a fourth work function metal layer to cover the first fin structure, the second fin structure, the third fin structure and the nanosheet stack.

17. The method of claim 16, wherein the first work function metal layer and the fourth work function metal layer are complementary to the second work function metal layer and the third work function metal layer.

18. The method of claim 16, wherein the forming of the second work function metal layer to cover the first fin structure, the third fin structure and the nanosheet stack further comprises:

forming the second work function metal layer over the substrate to cover the first fin structure, the second fin structure, the third fin structure and the nanosheet stack; and removing a portion of the second work function metal layer to expose the high-k gate dielectric over the second fin structure.

19. The method of claim 16, wherein the forming of the third work function metal layer to cover the second fin structure, the third fin structure and the nanosheet stack further comprises:

forming the third work function metal layer over the substrate to cover the first fin structure, the second fin structure, the third fin structure and the nanosheet stack; and removing a portion of the third work function metal layer to expose the high-k gate dielectric over the first fin structure.

20. The method of claim 16, further comprising forming a second passivation layer to cover the first fin structure, the second fin structure, the third fin structure and the nanosheet stack.

* * * * *